(12) United States Patent
Kato et al.

(10) Patent No.: US 8,255,844 B2
(45) Date of Patent: Aug. 28, 2012

(54) COORDINATED-DESIGN SUPPORTING APPARATUS, COORDINATED-DESIGN SUPPORTING METHOD, COMPUTER PRODUCT, PRINTED-CIRCUIT-BOARD MANUFACTURING METHOD, CIRCUIT-DESIGN SUPPORTING APPARATUS, CIRCUIT-DESIGN SUPPORTING METHOD, COMPUTER PRODUCT, AND PRINTED-CIRCUIT-BOARD MANUFACTURING METHOD

(75) Inventors: Yoshiyuki Kato, Kawasaki (JP); Hisashi Aoyama, Kawasaki (JP); Mitsuru Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 76 days.

(21) Appl. No.: 11/987,811

(22) Filed: Dec. 4, 2007

(65) Prior Publication Data

US 2008/0320433 A1 Dec. 25, 2008

Related U.S. Application Data

(63) Continuation-in-part of application No. 11/905,747, filed on Oct. 3, 2007, now Pat. No. 7,913,220, and a continuation-in-part of application No. 11/905,128, filed on Sep. 27, 2007, now Pat. No. 7,784,011, and a continuation-in-part of application No. 11/902,634, filed on Sep. 24, 2007, and a continuation-in-part of application No. 11/905,321, filed on Sep. 28, 2007, now Pat. No. 7,831,944, and a continuation-in-part of application No. 11/905,129, filed on Sep. 27, 2007, now Pat. No. 7,904,863.

(30) Foreign Application Priority Data

| Dec. 4, 2006 | (JP) | 2006-327388 |
|---|---|---|
| Dec. 4, 2006 | (JP) | 2006-327389 |
| Dec. 4, 2006 | (JP) | 2006-327390 |
| Dec. 4, 2006 | (JP) | 2006-327391 |
| Dec. 4, 2006 | (JP) | 2006-327392 |
| Nov. 27, 2007 | (JP) | 2007-305868 |
| Nov. 27, 2007 | (JP) | 2007-305869 |
| Nov. 27, 2007 | (JP) | 2007-305870 |
| Nov. 27, 2007 | (JP) | 2007-305871 |
| Nov. 27, 2007 | (JP) | 2007-305872 |

(51) Int. Cl.
*G06F 17/50* (2006.01)
(52) U.S. Cl. ...................................................... 716/100
(58) Field of Classification Search ................ 716/1, 11, 716/100
See application file for complete search history.

(56) References Cited

U.S. PATENT DOCUMENTS 5,297,053 A 3/1994 Pease et al.
(Continued)

FOREIGN PATENT DOCUMENTS

CN 1521830 A 8/2004
(Continued)

OTHER PUBLICATIONS

Office Action for corresponding Korean Application 10-2007-0098144; mailed Feb. 26, 2009.
(Continued)

*Primary Examiner* — Suchin Parihar
(74) *Attorney, Agent, or Firm* — Staas & Halsey LLP

(57) ABSTRACT

An FPGA-design-CAD interface unit retrieves pin assignment information created by an FPGA-designing CAD apparatus. An FPGA-pin-information managing unit manages the pin assignment information as FPGA pin information. A temporary-library creating unit creates a temporary component shape type library by using the FPGA pin information and outputs the temporary component shape type library in a form capable of being read by a package-designing CAD apparatus to a file.

13 Claims, 22 Drawing Sheets

U.S. PATENT DOCUMENTS

| | | | |
|---|---|---|---|
| 5,452,239 | A | 9/1995 | Dai et al. |
| 5,625,565 | A | 4/1997 | Van Dyke |
| 5,877,942 | A | 3/1999 | Kida et al. |
| 5,978,862 | A | 11/1999 | Kou et al. |
| 5,990,891 | A | 11/1999 | Fukaya |
| 6,239,611 | B1 | 5/2001 | Matera |
| 6,314,550 | B1 | 11/2001 | Wang et al. |
| 6,347,387 | B1 | 2/2002 | Fischer |
| 6,357,036 | B1 | 3/2002 | Eka et al. |
| 6,725,441 | B1 | 4/2004 | Keller et al. |
| 6,732,349 | B1 | 5/2004 | Sun et al. |
| 6,898,775 | B2 | 5/2005 | Erickson et al. |
| 7,024,654 | B2 | 4/2006 | Bersch et al. |
| 7,051,313 | B1 * | 5/2006 | Betz et al. ............... 716/17 |
| 7,073,158 | B2 | 7/2006 | McCubbrey |
| 7,080,365 | B2 | 7/2006 | Broughton et al. |
| 7,143,341 | B1 | 11/2006 | Kohli |
| 7,168,041 | B1 * | 1/2007 | Durrill et al. ............ 715/700 |
| 7,180,074 | B1 | 2/2007 | Crosetto |
| 7,218,567 | B1 | 5/2007 | Trimberger et al. |
| 7,281,233 | B1 | 10/2007 | Sivasubramaniam |
| 7,299,444 | B1 | 11/2007 | Tai et al. |
| 7,412,668 | B1 | 8/2008 | Duong |
| 7,444,612 | B2 | 10/2008 | Ariyama et al. |
| 7,711,674 | B2 * | 5/2010 | Arthur et al. ............. 706/62 |
| 7,831,944 | B2 | 11/2010 | Kato et al. |
| 2002/0073380 | A1 | 6/2002 | Cooke et al. |
| 2003/0009731 | A1 | 1/2003 | Wallace |
| 2005/0280438 | A1 | 12/2005 | Park |
| 2006/0059447 | A1 * | 3/2006 | Ariyama et al. ........... 716/10 |
| 2007/0100784 | A1 * | 5/2007 | Arthur et al. .............. 707/1 |
| 2007/0250800 | A1 * | 10/2007 | Keswick .................... 716/8 |
| 2008/0092089 | A1 | 4/2008 | Kobayashi |
| 2008/0134123 | A1 | 6/2008 | Kato et al. |
| 2008/0134124 | A1 | 6/2008 | Kato et al. |
| 2008/0134125 | A1 | 6/2008 | Kato et al. |
| 2008/0172442 | A1 | 7/2008 | Chen et al. |
| 2008/0263500 | A1 | 10/2008 | Kato et al. |
| 2008/0276213 | A1 | 11/2008 | Aoki et al. |

FOREIGN PATENT DOCUMENTS

| | | |
|---|---|---|
| JP | 03-263179 | 11/1991 |
| JP | 4-246778 | 9/1992 |
| JP | 6-163690 | 6/1994 |
| JP | 10-154055 | 6/1998 |
| JP | 10-222547 | 8/1998 |
| JP | 2000-029917 | 1/2000 |
| JP | 2000-99558 | 4/2000 |
| JP | 2000-181942 | 6/2000 |
| JP | 2001-092857 | 4/2001 |
| JP | 2002-279010 | 9/2002 |
| JP | 2003-030271 | 1/2003 |
| JP | 2003-30271 | 1/2003 |
| JP | 2003-036281 | 2/2003 |
| JP | 2006-79447 | 3/2006 |
| JP | 2006-079447 | 3/2006 |

OTHER PUBLICATIONS

U.S. Office Action to related U.S. Appl. No. 11/905,747; mailed May 12, 2009.

U.S. Office Action to related U.S. Appl. No. 11/905,321; mailed Jun. 19, 2009.

Korean Office Action for related Korean Application 10-2007-0097885; mailed Feb. 26, 2009.

Korean Office Action for related Korean Application 10-2007-0094203; mailed Feb. 25, 2009.

U.S. Office Action for related U.S. Appl. No. 11/902,634; mailed Jun. 30, 2009.

Chinese Office Action for related Chinese Application 200710161659.5; issued May 8, 2009.

Korean Office Action mailed Jun. 23, 2009 and issued in corresponding Korean Patent Application 10-2007-0104754.

Chinese Office Action issued Jul. 3, 2009 in corresponding Chinese Patent Application 200710166843.9.

U.S. Office Action mailed Dec. 18, 2009 in related U.S. Appl. No. 11/905,128.

U.S. Office Action mailed Dec. 10, 2009 in related U.S. Appl. No. 11/902,634.

U.S. Office Action mailed Jan. 12, 2010 in related U.S. Appl. No. 11/905,321.

Chinese Office Action issued Sep. 4, 2009 in corresponding Chinese Patent Application 200710162354.6.

U.S. Office Action mailed Nov. 18, 2009 in related U.S. Appl. No. 11/905,747.

U.S. Notice of Allowance for related U.S. Appl. No. 11/905,128; mailed May 12, 2010.

U.S. Office Action mailed Mar. 5, 2010 in related U.S. Appl. No. 11/905,129.

U.S. Notice of Allowance mailed Jul. 22, 2010 in related U.S. Appl. No. 11/905,321.

U.S. Office Action mailed Aug. 20, 2010 in related U.S. Appl. No. 11/905,129.

European Office Action for corresponding European Application 07117440.3; mailed Apr. 13, 2011.

European Office Action for corresponding European Application 07117411.4; mailed Apr. 19, 2011.

U.S. Notice of Allowance in related U.S. Appl. No. 11/905,129; mailed Dec. 9, 2010.

U.S. Notice of Allowance in related U.S. Appl. No. 11/905,747; mailed Dec. 23, 2010.

U.S. Notice of Allowance mailed Dec. 9, 2010 in related U.S. Appl. No. 11/905,129.

P. Garrault, "Methodologies for Efficient FPGA Integration Into PCBs", Mar. 13, 2003, pp. 1-15, XP002636269.

Steven Strell, "Increasing Productivity with Altera Ouartus II to I/O Designer/DxDesigner Interface", Oct. 2006, pp. 1-5, XP002637089.

European Search Report dated May 26, 2011 in corresponding European Patent Application 07117799.2.

C. Sweeney, "Hardware Design Methodologies", Feb. 21, 2002, pp. 1-53, XP002636270.

European Search Report dated May 30, 2011 in corresponding European Patent Application 07117435.3.

U.S. Office Action for related U.S. Appl. No. 11/902,634; mailed Oct. 12, 2011.

Japanese Office Action for corresponding Japanese Application 2007-305868; mailed Feb. 21, 2012.

U.S. Notice of Allowance for related U.S. Appl. No. 11/902,634; mailed Jan. 6, 2012.

Japanese Office Action for corresponding Japanese Application 2007-305869; mailed Feb. 14, 2012.

Japanese Office Action for corresponding Japanese Application 2007-305872; mailed Mar. 21, 2012.

Japanese Office Action for corresponding Japanese Application 2007-305870; mailed Mar. 21, 2012.

Japanese Office Action for corresponding Japanese Application 2007-305871; mailed Mar. 21, 2012.

Japanese Office Action for corresponding Japanese Applicaton 2007-305870; mailed Jul. 3, 2012.

* cited by examiner

WHEN REGISTERED
SYMBOL LIBRARY IS USED

WHEN SYMBOL LIBRARY IS
CREATED IN RESPONSE
TO WRITING

FIG.5

| PHYSICAL PIN NAME | LOGICAL PIN NAME | INPUT/OUTPUT ATTRIBUTE | BANK NUMBER | SWAP-GROUP NUMBER | DIFFERENTIAL ATTRIBUTE | POWER SUPPLY VOLTAGE |
|---|---|---|---|---|---|---|
| A0 | ADRS1 | INPUT | 1 | 1 | | |
| A1 | VCCIO | POWER SUPPLY | | | | 3.3V |
| A2 | ADRS2 | INPUT | 1 | 1 | | |
| A3 | GND | GROUND | | | | |
| A4 | DATA1 | OUTPUT | 1 | 1 | POSI | |
| A5 | DATA2 | OUTPUT | 1 | 1 | NEGA | |
| A6 | VCCINT | POWER SUPPLY | | | | 1.5V |
| | | | | | | |
| C10 | ADRSB1 | INPUT | 2 | 2 | | |
| C11 | ADRSB2 | INPUT | 2 | 2 | | |
| C12 | ADRSB3 | INPUT | 2 | 2 | | |
| | | | | | | |

| TARGET PIN INTERVAL: COMPONENT IC1   PHYSICAL PIN NAME G1 |
| --- |
| COMPONENT I12   PHYSICAL PIN NAME 2 |
| SPECIFICATION: 50 MM OR BELOW |
| TARGET PIN INTERVAL: COMPONENT IC1   PHYSICAL PIN NAME F1 |
| COMPONENT I12   PHYSICAL PIN NAME 4 |
| SPECIFICATION: 50 MM OR BELOW |
| TARGET PIN INTERVAL: COMPONENT IC1   PHYSICAL PIN NAME E1 |
| COMPONENT I12   PHYSICAL PIN NAME 6 |
| SPECIFICATION: 70 MM OR BELOW |

FIG.11

| PHYSICAL PIN NAME: | A0 |
| LOGICAL PIN NAME: | ADRS2 |

| PHYSICAL PIN NAME: | A2 |
| LOGICAL PIN NAME: | ADRS1 |

| PHYSICAL PIN NAME: | D1 |
| LOGICAL PIN NAME: | TXD113 |

| PHYSICAL PIN NAME: | E1 |
| LOGICAL PIN NAME: | TXD115 |

| PHYSICAL PIN NAME: | F1 |
| LOGICAL PIN NAME: | TXD106 |

| PHYSICAL PIN NAME: | G1 |
| LOGICAL PIN NAME: | TXD108 |

FIG.12

NET " TXD113" LOC="D1";
NET " TXD115" LOC="E1";
NET " TXD106" LOC="F1";
NET " TXD108" LOC="G1";

FIG.21

```
PARTDEF ;
   DATA: IC1 , FPGA/SW ;
   DATA: IC2 , CAXXXXX ;
PARTEND ;

NETDEF ;
   NET: NET1 ;
      DATA: IC1.DATA1 , IC2.1 ;
   NET: NET2 ;
      DATA: IC1.DATA2 , IC2.2 ;
   NET: NET3 ;
      DATA: IC1.%A3, IC2.3 ;
NETEND ;
```

COMPONENT DEFINING UNIT
COMPONENT NAME AND COMPONENT LIBRARY NAME ARE DESCRIBED FOR COMPONENT USED FOR CONSIDERATION.
AS FOR FPGA COMPONENT, "FPGA/" + MODULE NAME (NAME FOR DISTINGUISHING FPGA) IS DESCRIBED, BECAUSE THERE IS NO COMPONENT LIBRARY.

NET DEFINING UNIT
NET NAME AND COMPONENT PIN CONNECTED TO NET ARE DESCRIBED IN FORM OF "(COMPONENT NAME).(COMPONENT PIN NAME)" FOR EACH NET.
AS FOR FPGA COMPONENT, LOGICAL PIN NAME OR PHYSICAL PIN NAME IS DESCRIBED AS PIN NAME. (PHYSICAL PIN NAME IS MARKED WITH "%".)

COORDINATED-DESIGN SUPPORTING APPARATUS, COORDINATED-DESIGN SUPPORTING METHOD, COMPUTER PRODUCT, PRINTED-CIRCUIT-BOARD MANUFACTURING METHOD, CIRCUIT-DESIGN SUPPORTING APPARATUS, CIRCUIT-DESIGN SUPPORTING METHOD, COMPUTER PRODUCT, AND PRINTED-CIRCUIT-BOARD MANUFACTURING METHOD

CROSS-REFERENCE TO RELATED APPLICATIONS

This application is a continuation-in-part of prior U.S. Application Nos.: application Ser. No. 11/905,747, filed on Oct. 3, 2007; application Ser. No. 11/905,128, filed on Sep. 27, 2007; application Ser. No. 11/902,634, filed on Sep. 24, 2007; application Ser. No. 11/905,321, filed on Sep. 28, 2007; and application Ser. No. 11/905,129, filed on Sep. 27, 2007; and it being further noted that priority is based upon the prior Japanese Patent Application Nos.: 2006-327392, filed on Dec. 4, 2006; 2006-327391, filed on Dec. 4, 2006; 2006-327390, filed on Dec. 4, 2006; 2006-327389, filed on Dec. 4, 2006; 2006-327388, filed on Dec. 4, 2006; 2007-305868, filed on Nov. 27, 2007; 2007-305869, filed on Nov. 27, 2007; 2007-305870, filed on Nov. 27, 2007; 2007-305871, filed on Nov. 27, 2007; & 2007-305872, filed on Nov. 27, 2007.

BACKGROUND OF THE INVENTION

1. Field of the Invention

The present invention relates to a technology that enables consideration of an early pin assignment by using a package-designing CAD apparatus in designing a printed circuit board including an integrated circuit such as a Programmable Logic Device (PLD) component and a technology for supporting (aiding) designing a circuit in which an integrated circuit for a PLD or the like is used as a component.

2. Description of the Related Art

In designing a printed circuit board including a PLD component such as Field Programmable Gate Array (FPGA), a PLD designer, a circuit designer, and a package designer exchange design information such as pin assignment information.

A PLD-designing CAD apparatus for supporting PLD designing, a circuit-designing CAD apparatus for supporting circuit designing, and a package-designing CAD apparatus for supporting package designing respectively hold design information, and thus it is important to maintain a consistency among the design information held by each of the apparatuses. Therefore, for example, when pin assignment is changed in package designing, the change needs to be reflected in PLD design information.

Consequently, a technology has been developed in which pin replacement in package designing is reflected in PLD design information. For example, Japanese Patent Application Laid-Open No. 2006-79447 discloses an FPGA design supporting apparatus in which information on changed pin layout can be reflected in FPGA design information.

However, there is a problem that a component shape type library is required to consider a package design by using the package-designing CAD apparatus, though, there is no component shape type library of the PLD component when the PLD designer and the package designer consider an early pin assignment. Therefore, the package designer cannot consider the pin assignment by using the package-designing CAD apparatus.

Furthermore, a conventional circuit-designing CAD apparatus performs a design rule check of a circuit diagram, which is designed by a circuit designer, by referring to a component library. In this case, as the design rule check, there are described, for example, an input/output attribute check to check whether the number of output pins is one by using an input/output attribute of each of pins with respect to each of nets, a differential signal check to check whether all pins included in a net have the same differential attribute, and a power-supply voltage check to check whether a voltage value of a power supply pin is identical to a power supply voltage of a net.

Moreover, Japanese Patent Application Laid-Open No. H4-246778 discloses such a technology that, when input/output pins of a semiconductor integrated circuit are to be arranged, the input/output pins are arranged after being subjected to a physical check and an electrical check by using logical connection information, package information, and library information.

However, when a circuit-design supporting apparatus performs a design rule check of a circuit diagram in which a PLD such as an FPGA (Field Programmable Gate Array) is used as a component, precise information on the PLD is not registered in a component library to be referred by the circuit-design supporting apparatus. Therefore, the design rule check cannot be performed precisely.

Namely, in the component library, a pin attribute (an input/output attribute, a differential attribute, a power supply voltage, and the like) of the PLD is not an attribute that is obtained after a program is written. Therefore, it is not possible to perform the input/output attribute check, the differential signal check, and the power-supply voltage check.

SUMMARY OF THE INVENTION

It is an object of the present invention to at least partially solve the problems in the conventional technology.

According to an aspect of the present invention, a coordinated-design supporting apparatus includes a pin-assignment-information receiving unit that receives pin assignment information created by using an integrated circuit-designing CAD with respect to an integrated circuit; and a temporary-library creating unit that creates a temporary component shape type library as a temporary library subject to the integrated circuit by using the pin assignment information, the temporary component shape type library being alternative to a component shape type library required by a package-designing CAD apparatus.

According to another aspect of the present invention, a method for supporting coordinated-design includes receiving pin assignment information that is created by using an integrated circuit-designing CAD with respect to an integrated circuit; and creating a temporary component shape type library as a temporary library subject to the integrated circuit by using the pin assignment information, the temporary component shape type library being alternative to a component shape type library required by a package-designing CAD apparatus.

According to still another aspect of the present invention, a printed-circuit-board manufacturing method that is designed by a coordinated-design supporting apparatus that supports a coordinated design between a package design and an integrated circuit design of the printed circuit board, wherein the coordinated-design supporting apparatus performs receiving pin assignment information that is created by using an integrated circuit-designing CAD with respect to an integrated circuit; and creating a temporary component shape type library as a temporary library subject to the integrated circuit by using the pin assignment information, the temporary component shape type library being alternative to a component shape type library required by a package-designing CAD apparatus.

According to still another aspect of the present invention, a circuit-design supporting apparatus supports designing a circuit in which an integrated circuit is used as a component, and the circuit-design supporting apparatus includes an integrated circuit-information receiving unit that receives integrated circuit information, which is design information created by using an integrated circuit-designing CAD with respect to the integrated circuit; and a library creating unit that creates a symbol library of the integrated circuit to be used in a circuit design by using the integrated circuit information.

According to still another aspect of the present invention, a circuit-design supporting apparatus that supports designing a circuit in which an integrated circuit is used as a component, the circuit-design supporting apparatus includes an integrated circuit-information receiving unit that receives integrated circuit information, which is design information created by using an integrated circuit-designing CAD with respect to an integrated circuit; and a DRC unit that performs a design rule check by using the integrated circuit information.

According to still another aspect of the present invention, a circuit-design supporting apparatus that supports designing a circuit in which an integrated circuit is used as a component includes a pin-swap-information receiving unit that receives pin swap information, which is information on a pin swap performed in a package design with respect to the integrated circuit; and a pin-swap processing unit that reflects the pin swap in a circuit diagram by using the pin swap information.

According to still another aspect of the present invention, a computer-readable recording medium stores therein a computer program that causes a computer to implement the above methods.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a diagram of an example of FPGA information stored in an FPGA-information storing unit;

FIG. 11 is a diagram of an example of notification information that is output to an FPGA-designing CAD apparatus by a history output unit;

FIG. 12 is a diagram of an output format of the notification information;

FIG. 21 is a diagram of an example of a net list retrieved by a net-list retrieving unit;

DETAILED DESCRIPTION OF THE PREFERRED EMBODIMENTS

Exemplary embodiments according to the invention are explained in detail below with reference to the accompanying drawings. Incidentally, a case in which the present invention is applied to an FPGA is mainly explained in the embodiments.

Figure 1:
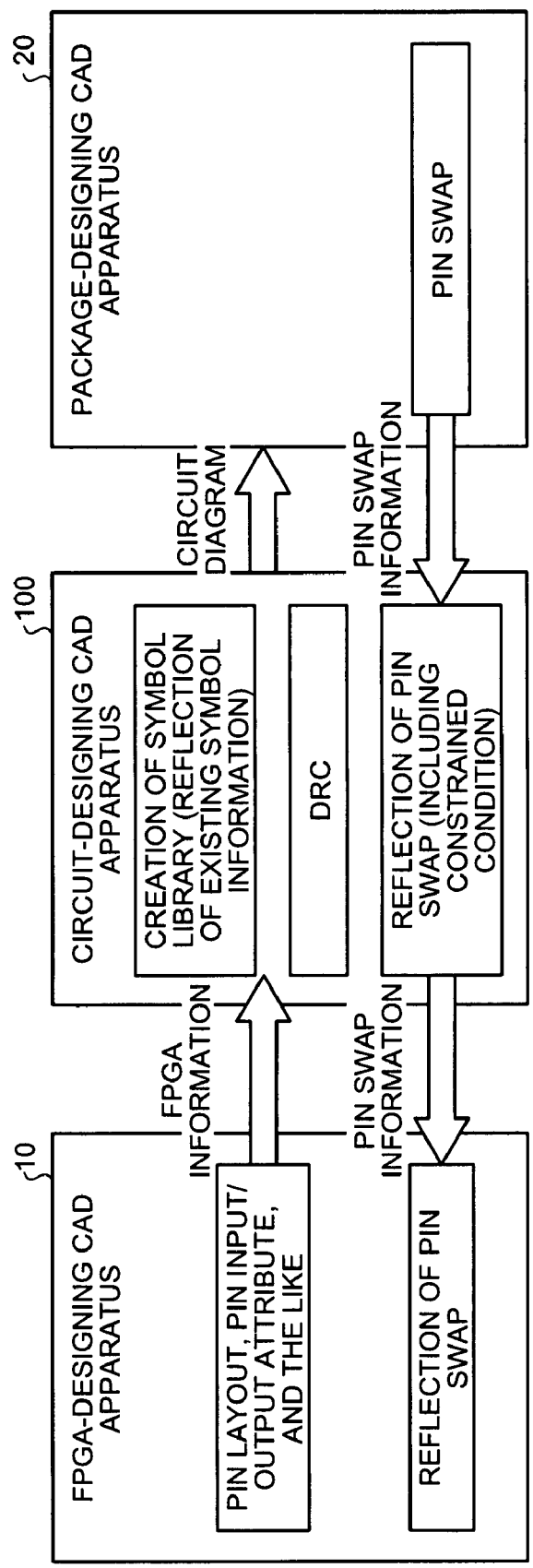
FIG. 1 is an explanatory diagram for explaining a concept of an FPGA coordinated design according to a first embodiment of the present invention.

First, a concept of an FPGA coordinated design according to a first embodiment of the present invention is explained. FIG. 1 is an explanatory diagram for explaining the concept of the FPGA coordinated design according to the first embodiment. As shown in the drawing, in the FPGA coordinated design according to the first embodiment, an FPGA-designing CAD apparatus 10 that supports an FPGA design, a package-designing CAD apparatus 20 that supports a package design of a printed circuit board, and a circuit-designing CAD apparatus 100 as a circuit design supporting apparatus that supports a circuit design cooperate with one another to support a designer.

Specifically, the circuit-designing CAD apparatus 100 receives FPGA information such as a pin layout that is created by the FPGA-designing CAD apparatus 10, and creates a symbol library. When creating a symbol library of an FPGA, if the FPGA subjected to create a symbol library is arranged in a circuit diagram, i.e., if a symbol library is newly created due to a change in the FPGA, the circuit-designing CAD apparatus 100 creates a symbol library by using information on the existing symbol, such as a portion assignment and a layout of a symbol pin, as much as possible.

As described above, the circuit-designing CAD apparatus 100 creates the symbol library of the FPGA by using the FPGA information, so that a circuit designer needs not create the symbol library of the FPGA. Therefore, workloads of the circuit designer can be reduced. Also, when a symbol library is newly created due to a change of the FPGA, the circuit-designing CAD apparatus 100 creates a symbol library by using information on the existing symbol as much as possible. Therefore, it is possible to reduce modifications of the circuit diagram, and thus an efficiency of the circuit design can be improved.

Furthermore, when a DRC (design rule check) is performed, the circuit-designing CAD apparatus 100 performs the DRC by referring to the FPGA information such as a pin input/output attribute that is created by the FPGA-designing CAD apparatus 10. For example, the circuit-designing CAD apparatus 100 checks the number of output pins by referring to the pin input/output attribute of the FPGA with respect to each of nets. In this manner, the circuit-designing CAD apparatus 100 performs the DRC by referring to the FPGA information such as the pin input/output attribute, and thus the DRC can be performed more precisely.

Furthermore, when a pin swap occurs in a package design, the circuit-designing CAD apparatus 100 retrieves pin swap information from the package-designing CAD apparatus 20, and reflects the pin swap in the symbol library, the circuit diagram, and the like. In addition, the circuit-designing CAD apparatus 100 reflects the pin swap in the package design in a constrained condition such as a length of a line between pins. In this manner, the circuit-designing CAD apparatus 100 also reflects the pin swap in the package design in the constrained condition, and thus it is possible to eliminate an inconsistency of circuit design information and package design information.

Furthermore, the circuit-designing CAD apparatus 100 records a history of the pin swap in the package design, and provides the history information of the pin swap to the FPGA-designing CAD apparatus 10. In this manner, the circuit-designing CAD apparatus 100 records the history of the pin swap in the package design, and provides the history information of the pin swap to the FPGA-designing CAD apparatus 10, and thus it is possible to ensure a consistency among the FPGA design, the circuit design, and the package design.

Figure 2:
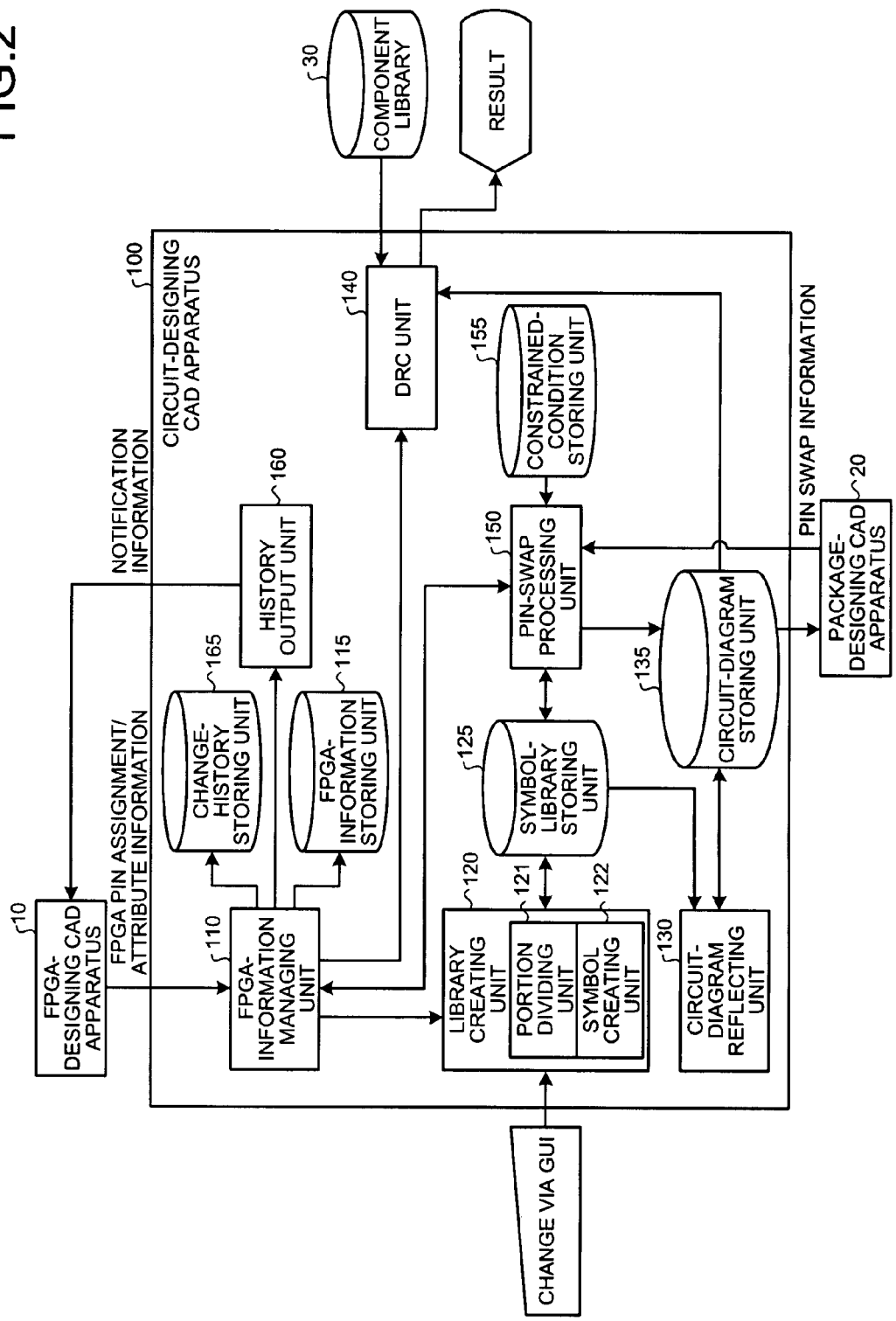
FIG. 2 is a functional block diagram of the FPGA coordinated design system according to the first embodiment.

Subsequently, a configuration of an FPGA coordinated design system according to the first embodiment is explained. FIG. 2 is a functional block diagram of the FPGA coordinated design system according to the first embodiment. As shown in the drawing, the FPGA coordinated design system includes the FPGA-designing CAD apparatus 10, the package-designing CAD apparatus 20, and the circuit-designing CAD apparatus 100.

Figure 3:
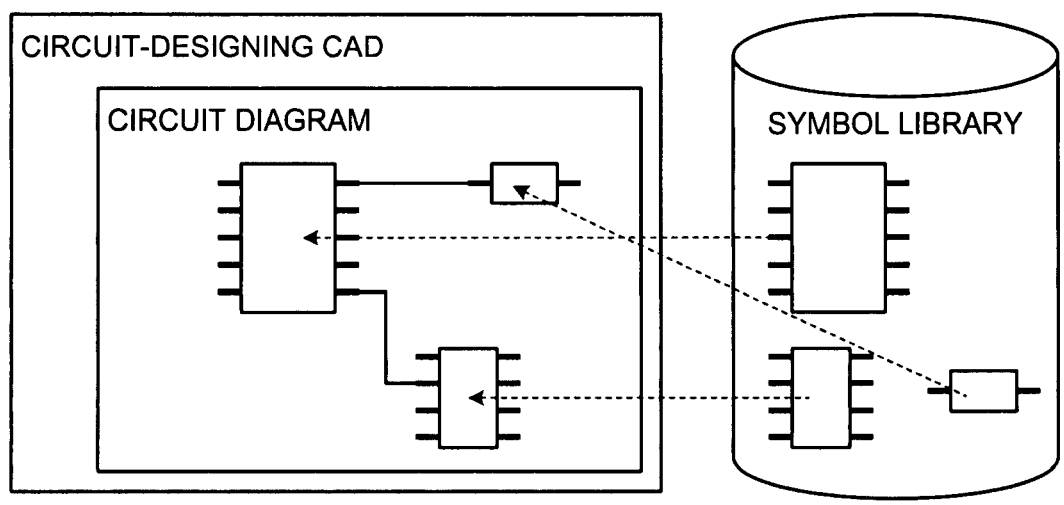
FIG. 3 is an explanatory diagram for explaining circuit designing.

The circuit-designing CAD apparatus 100 supports a circuit design in which an FPGA is used as a component in cooperation with the FPGA-designing CAD apparatus 10 and the package-designing CAD apparatus 20. FIG. 3 is an explanatory diagram for explaining the circuit design. As shown in the drawing, the circuit designer arranges a symbol, which is registered as a symbol library associated with a component, in a circuit diagram, and connects symbol pins to each other, thereby designing the circuit.

Figure 4A:
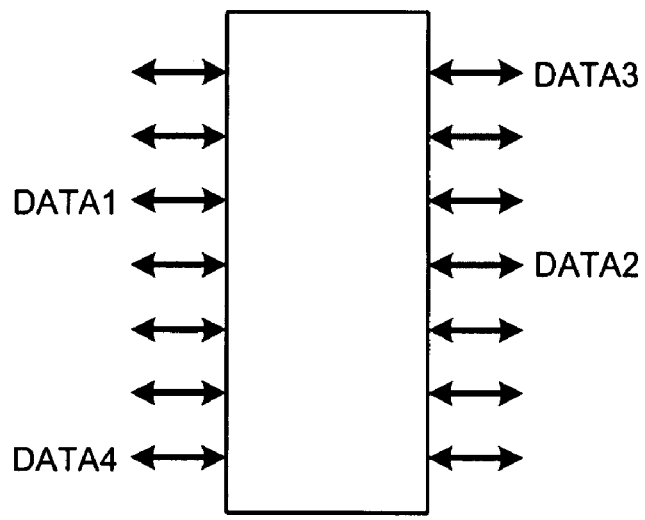
FIGS. 4A and 4B are explanatory diagrams for explaining a symbol library of an FPGA.

In a case of the FPGA, however, if a symbol is registered as a symbol library before a program is written thereon, pins are defined as input/output pins because the pins can be used for either an input or an output. Therefore, when the registered symbol library is used, a pin used for an input is located on the right, conversely, a pin used for an output is located on the left, or buses are not arranged sequentially as shown in FIG. 4A, and thus the circuit diagram is complicated.

Figure 4B:
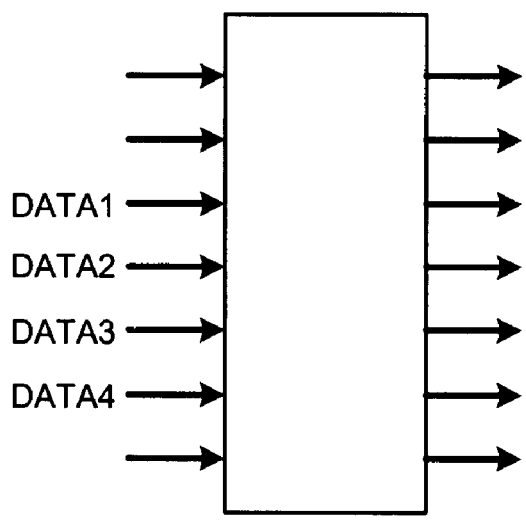

Therefore, it is necessary to create a symbol library each time a program is written. Consequently, in this case, the circuit-designing CAD apparatus 100 creates a symbol library of the FPGA each time a program is written. By creating a symbol library of the FPGA each time a program is written, as shown in FIG. 4B, pins used for an input can be arranged on the left, and also buses can be arranged sequentially.

To return to the explanation of FIG. 2, the circuit-designing CAD apparatus 100 includes an FPGA-information managing unit 110, an FPGA-information storing unit 115, a library creating unit 120, a symbol-library storing unit 125, a circuit-diagram reflecting unit 130, a circuit-diagram storing unit 135, a DRC unit 140, a pin-swap processing unit 150, a constrained-condition storing unit 155, a history output unit 160, and a change-history storing unit 165.

The FPGA-information managing unit 110 is a processing unit for managing FPGA information. The FPGA-information managing unit 110 retrieves FPGA information, such as a correspondence between a physical pin and a logical pin, a pin input/output attribute, a voltage value, and a bank number, from a file output by the FPGA-designing CAD apparatus 10, and stores the retrieved FPGA information in the FPGA-information storing unit 115.

In such a case, after the FPGA-information managing unit 110 first stores the FPGA information in the FPGA-information storing unit 115, when the FPGA-information managing unit 110 retrieves FPGA information and stores anew the retrieved FPGA information in the FPGA-information storing unit 115, the FPGA-information managing unit 110 further stores a change history indicating a change of the FPGA-information in the change-history storing unit 165.

The FPGA-information storing unit 115 is a storing unit that stores therein FPGA-information under the control of the FPGA-information managing unit 110. FIG. 5 is a diagram of an example of FPGA information stored in the FPGA-information storing unit 115. As shown in the drawing, the FPGA-information storing unit 115 stores therein a physical pin name, a logical pin name, an input/output attribute, a bank number, a swap-group number, a differential attribute, and a power supply voltage with respect to each of pins.

The library creating unit 120 is a processing unit for creating a symbol library of the FPGA by using the FPGA information stored in the FPGA-information storing unit 115, and stores the created symbol library in the symbol-library storing unit 125. The library creating unit 120 includes a portion dividing unit 121 and a symbol creating unit 122. The portion dividing unit 121 divides the circuit diagram into portions. The symbol creating unit 122 creates a symbol of each of the portions divided by the portion dividing unit 121.

The portion dividing unit 121 divides the circuit diagram into portions based on a portion dividing rule that is specified by a user via a GUI. As the portion dividing, the circuit diagrams are divided into the portions by each bank number, each bank group, each logical pin name, or the like. Furthermore, the portion dividing unit 121 determines positions of the rightmost pin and the leftmost pin on a symbol based on input/output attributes, and determines the order of pins by sorting by attributes of the pins. Furthermore, the portion dividing unit 121 receives a specification for displacing a pin between portions from the user via the GUI, and displaces the pin.

Furthermore, when creating a symbol library, the library creating unit 120 checks whether a symbol of the FPGA subjected to create the symbol is arranged in the circuit diagram. If the symbol is arranged in the circuit diagram, the library creating unit 120 creates a symbol library by referring to information on the arranged symbol.

Specifically, the library creating unit 120 performs a portion assignment by referring a logical pin name as a key to the existing symbol library. Furthermore, the library creating unit 120 creates a symbol library in which a symbol pin is arranged in the same position as a position where a previous pin is located in the existing symbol library. Namely, the library creating unit 120 assigns a pin having a logical pin name, which is included in the existing symbol, to the same position of the same portion as a position where a previous pin is located in the existing portion, and assigns a pin having a logical pin name, which is not included in the existing symbol, to the same portion as a portion where a previous pin having the same physical pin name is located. Furthermore, the library creating unit 120 arranges a pin having a logical pin name, which is not identical to that is used in the existing symbol, in an unoccupied position on the symbol library. If there is no unoccupied position on the symbol library, the library creating unit 120 extends a size of the symbol library in a downward direction, and arranges the pin in the extended position.

When a symbol of the FPGA subjected to create the symbol is arranged in the circuit diagram, the library creating unit 120 creates a symbol library by referring to the information on the arranged symbol, and thus it is possible to minimize modifications of the circuit diagram due to a change of the FPGA design.

Figure 6:
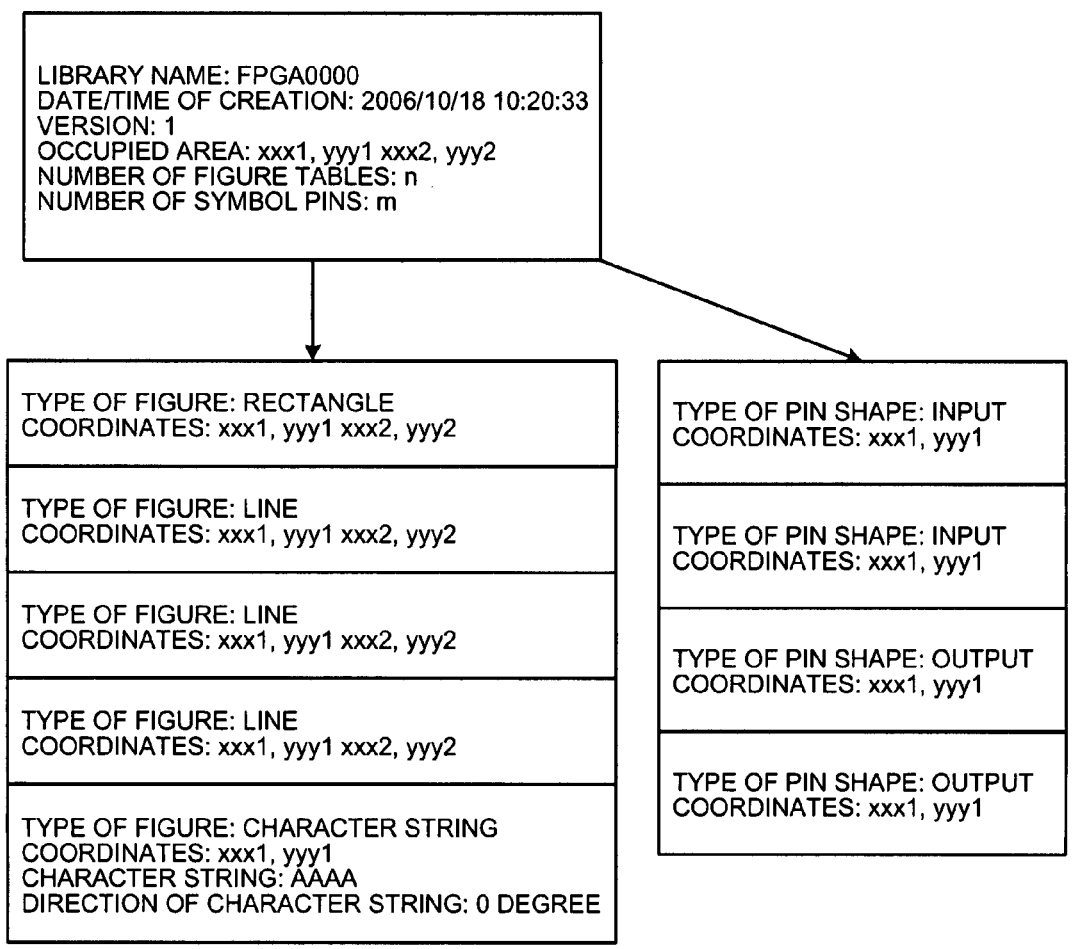
FIG. 6 is a diagram of an example of a symbol library stored in a symbol-library storing unit.

The symbol-library storing unit 125 is a storing unit that stores therein a symbol library of the FPGA. FIG. 6 is a diagram of an example of a symbol library stored in the symbol-library storing unit 125. As shown in the drawing, the symbol-library storing unit 125 stores therein information on a library name, a date/time of creation, a version, an occupied area, the number of figure tables, and the number of symbol pins, information on each of figures forming a symbol, and information on each of pins.

The circuit-diagram reflecting unit 130 is a processing unit that replaces, if a symbol of the FPGA in which the symbol library is created by the library creating unit 120 is arranged in the circuit diagram, the arranged symbol with a newly-created symbol. If a line is connected to a pin having a logical pin name different from a previous logical pin name which is used before the replacement, the circuit-diagram reflecting unit 130 cuts off the line.

If a line is connected to a pin having a logical pin name different from a previous logical pin name which is used before the replacement, the circuit-diagram reflecting unit 130 cuts off the line, and thus it is possible to reduce missing a modification of the circuit diagram due to a change of the FPGA design.

The circuit-diagram storing unit 135 is a storing unit that stores therein information on the circuit diagram in which components are arranged. The circuit-diagram storing unit 135 is updated by the circuit-diagram reflecting unit 130, if a symbol of the FPGA in which the symbol library is created by the library creating unit 120 is arranged in the circuit diagram.

The DRC unit 140 is a processing unit that performs a DRC. The DRC unit 140 performs a DRC by referring to the FPGA information managed by the FPGA-information managing unit 110 in addition to information stored in a component library 30. Specifically, the DRC unit 140 checks an input/output attribute, a differential signal, a power supply voltage, and the like. The DRC unit 140 performs the DRC by referring to the FPGA information, and thus the DRC associated with the FPGA can be performed precisely.

The pin-swap processing unit 150 is a processing unit that receives pin swap information output by the package-designing CAD apparatus 20, and reflects the pin swap performed in the package design in the FPGA information, the symbol library, and the circuit diagram. In the FPGA, an operation inside the components can be changed by writing on a program, so that a pin replacement (a pin swap) of FPGA components is performed in a phase of the package design to make the pin assignment easily. Therefore, the pin-swap processing unit 150 performs a process of reflecting the pin swap in the package design in the circuit design.

Figure 7:
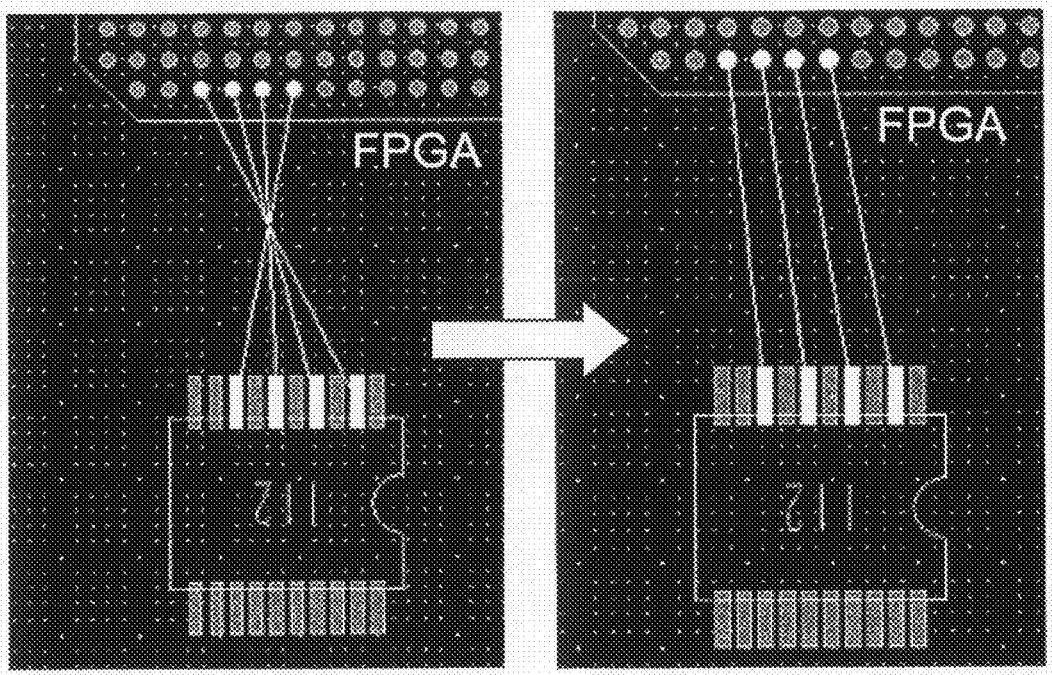
FIG. 7 is a diagram of an example of a pin swap.
Figures 8, 9:
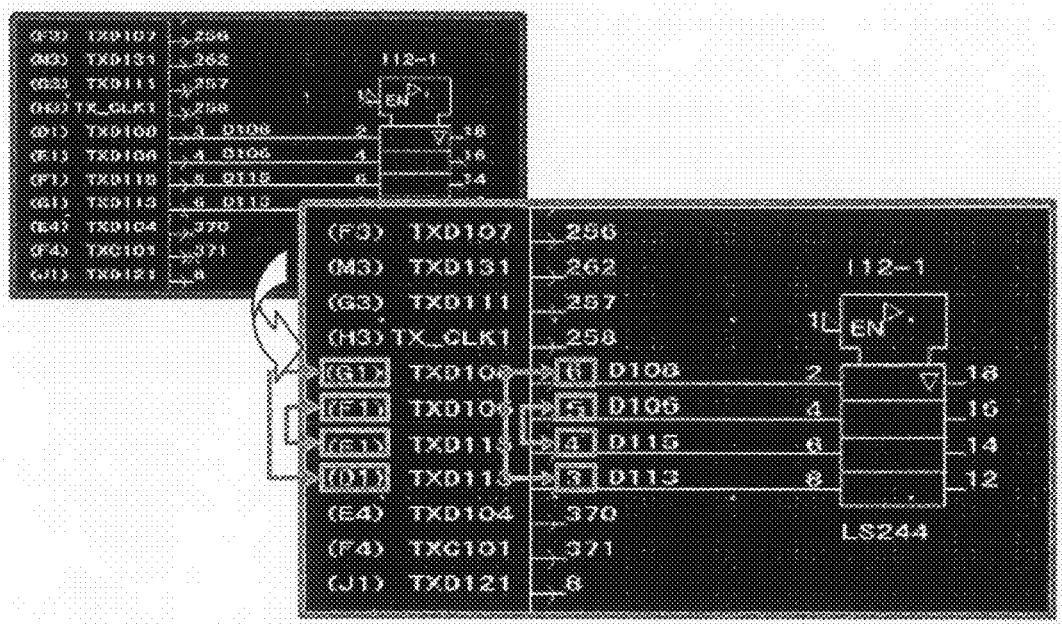
FIG. 8 is a diagram of an example of how a pin swap is reflected in a circuit diagram.
FIG. 9 is a diagram of an example of a constrained condition stored in a constrained-condition storing unit.

FIG. 7 is a diagram of an example of a pin swap. As shown in the drawing, when lines connecting between the FPGA and other component are crossed, the crossing of the lines can be eliminated by the pin swap of the FPGA. FIG. 8 is a diagram of an example of how a pin swap is reflected in the circuit diagram. As shown in the drawing, in the circuit diagram, a pin layout is changed in symbols that respectively have a physical pin name "D1", "E1", "F1", and "G1".

The pin-swap processing unit 150 further reflects the pin swap in the package design in a constrained condition such as a length of a line distance between pins. The pin-swap processing unit 150 further reflects the pin swap in the package design in the constrained condition, and thus it is possible to ensure a consistency of design information between the circuit design and the package design.

Furthermore, the pin-swap processing unit 150 instructs the FPGA-information managing unit 110 to store a change history of the FPGA information due to the pin swap. Then, the FPGA-information managing unit 110 stores the change history in the change-history storing unit 165.

The constrained-condition storing unit 155 is a storing unit that stores therein a constrained condition relating to the circuit design, such as a length of a line between pins. FIG. 9 is a diagram of an example of a constrained condition stored in the constrained-condition storing unit 155. As shown in the drawing, the constrained-condition storing unit 155 stores therein a constrained condition relating to a length of a line distance between pins. For example, there is stored as a constrained condition that a length of a line between a pin having a physical pin name "G1" of a component "IC1" and a pin having a physical pin name "2" of a component "I12" is 50 mm or below.

The history output unit 160 is a processing unit that outputs a change history of the FPGA information, which is changed in the process of reflecting the pin swap performed by the pin-swap processing unit 150, as notification information to a file in a form capable of inputting to the FPGA-designing CAD apparatus 10.

Figure 10:
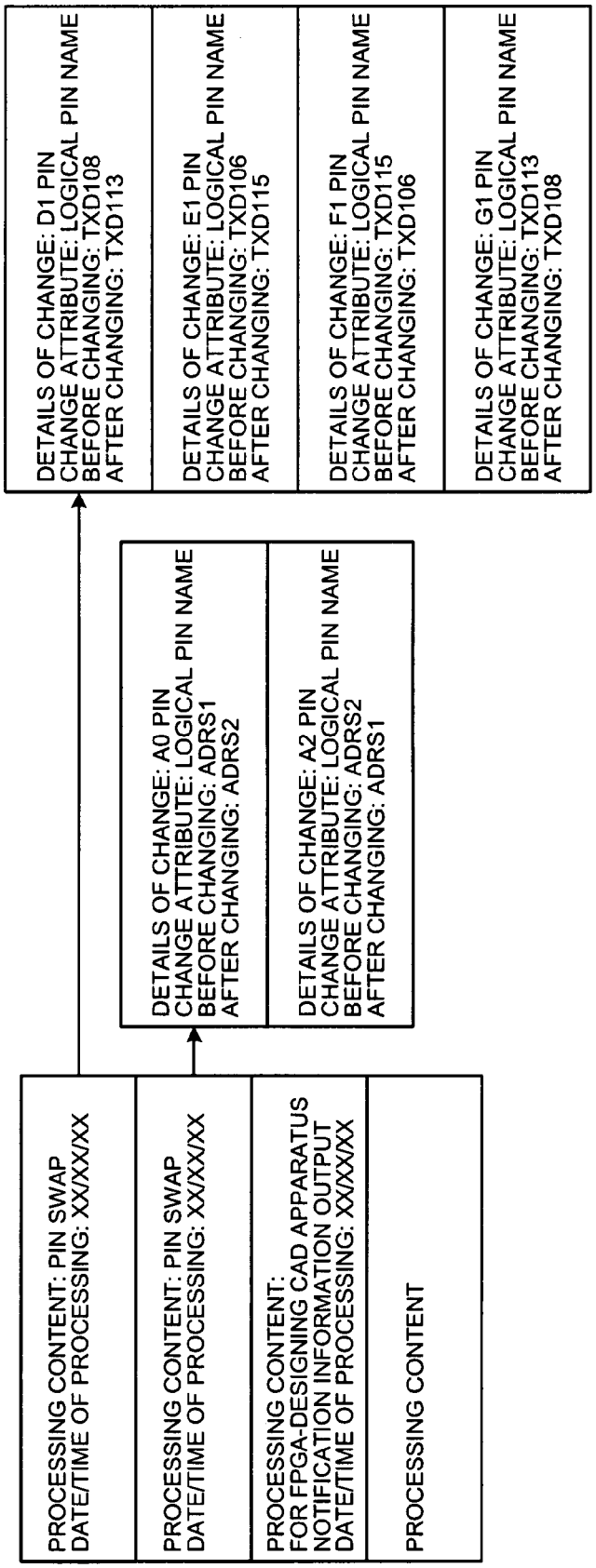
FIG. 10 is a diagram of an example of a change history stored in a change-history storing unit.

The change-history storing unit 165 is a storing unit that stores therein a change history of the FPGA information, and managed by the FPGA-information managing unit 110. FIG. 10 is a diagram of an example of a change history stored in the change-history storing unit 165. As shown in the drawing, the change-history storing unit 165 stores therein changed information on a date/time of processing and a swapped pin each time a process of pin swapping is performed. Furthermore, the change-history storing unit 165 stores therein a date/time of processing each time the history output unit 160 outputs a change history and also each time the FPGA-information managing unit 110 retrieves FPGA information from the FPGA-designing CAD apparatus 10.

FIG. 11 is a diagram of an example of notification information that is output to the FPGA-designing CAD apparatus 10 by the history output unit 160. As shown in the drawing, the history output unit 160 outputs a physical pin name and a changed logical pin name after a pin swap, as notification information, with respect to each of swapped pins. FIG. 12 is a diagram of an output format of the notification information.

In this manner, the change-history storing unit 165 stores therein a change history of FPGA information, and the history output unit 160 outputs the change history as notification information to a file in a form capable of inputting to the FPGA-designing CAD apparatus 10. Thus, it is possible to ensure a consistency of design information among the package design, the circuit design, and the FPGA design.

Figure 13:
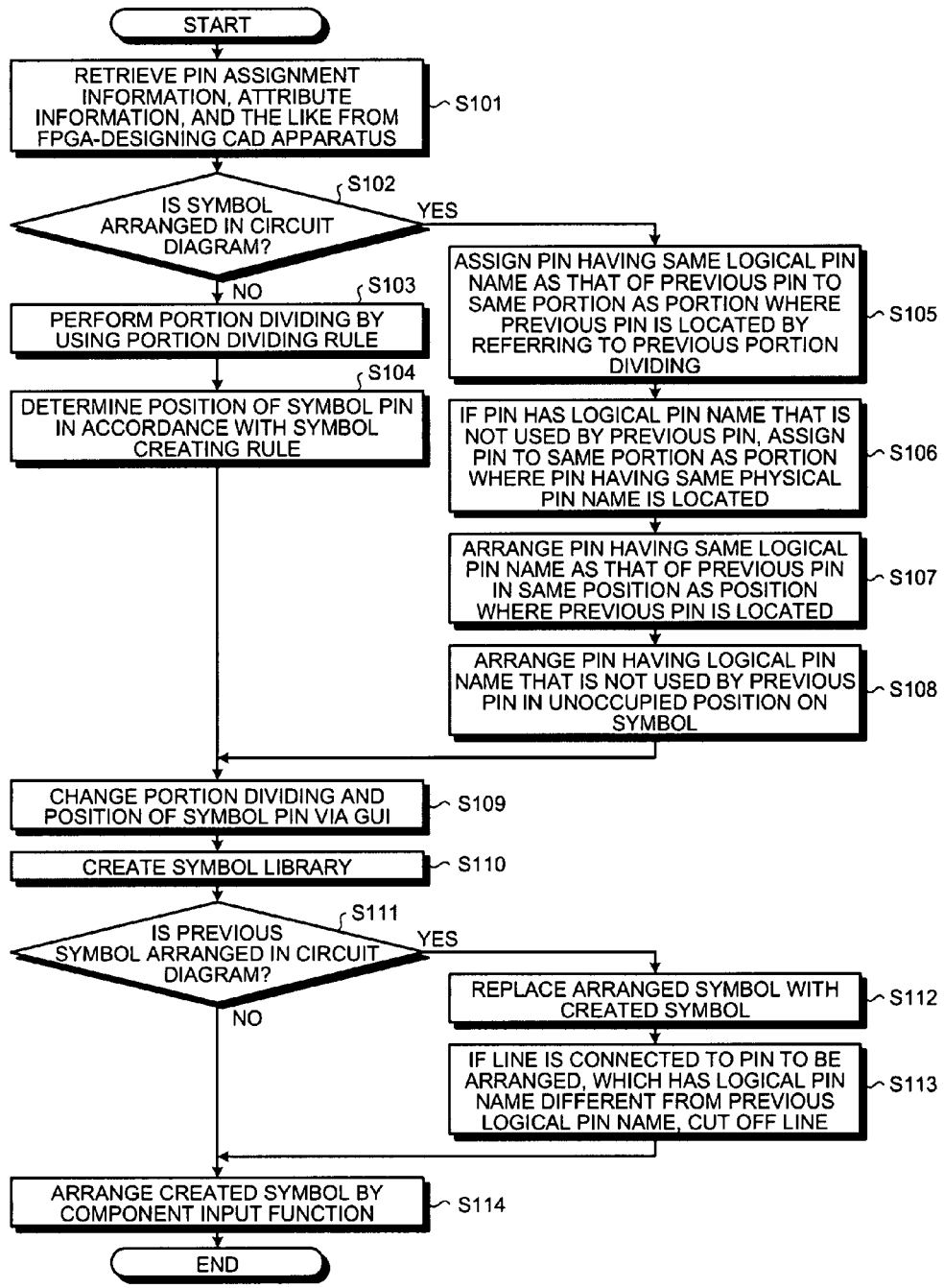
FIG. 13 is a flowchart of a process for creating a symbol library and a process for arranging a symbol, which are performed by a circuit-designing CAD apparatus.

Subsequently, processing procedures of creating a symbol library and a process of arranging a symbol, which are performed by the circuit-designing CAD apparatus 100, are explained. FIG. 13 is a flowchart of the processing procedures of creating a symbol library and a process of arranging a symbol, which are performed by the circuit-designing CAD apparatus 100.

As shown in the drawing, in the circuit-designing CAD apparatus 100, the FPGA-information managing unit 110 retrieves FPGA information, such as pin assignment information and attribute information, from a file output by the FPGA-designing CAD apparatus 10, and stores the retrieved FPGA information in the FPGA-information storing unit 115 (step S101).

Then, the library creating unit 120 determines whether a symbol corresponding to the FPGA information retrieved by the FPGA-information managing unit 110 is arranged in the circuit diagram (step S102). If the symbol is not arranged in the circuit diagram, the library creating unit 120 divides the circuit diagram into portions by using a portion dividing rule that is specified by the user (step S103), and determines a position of a symbol pin in accordance with a predetermined rule for creating a symbol, for example, by assigning pins to the right or left based on input/output attributes (step S104).

If the symbol is arranged in the circuit diagram, the library creating unit 120 assigns a pin having the same logical pin name as that of a previous pin to the same portion as a portion where the previous pin is located by referring to the previously-performed portion assignment (step S105). If a pin has a logical pin name that is not used by a previous pin, the library creating unit 120 assigns the pin to the same portion as a portion where a previous pin having the same physical pin name is located (step S106). Then, the pin having the same logical pin name as that of the previous pin is arranged in the same position as a position where the previous pin is located (step S107), and the pin having the logical pin name that is not used by the previous pin is arranged in an unoccupied position on the symbol (step S108).

The library creating unit 120 receives a specification for changing a portion assignment or a pin position from the user via the GUI. If the changes are specified, the library creating unit 120 creates a symbol library by changing the portion assignment or the pin position (step S109), and stores the created symbol library in the symbol-library storing unit 125 (step S110).

Then, the circuit-diagram reflecting unit 130 determines whether a previous symbol of the FPGA in which the symbol library is created by the library creating unit 120 is arranged in the circuit diagram (step S11). If the previous symbol is arranged in the circuit diagram, the circuit-diagram reflecting unit 130 replaces the arranged symbol with a newly-created symbol (step S112). If a line is connected to a pin to be arranged, which has a logical pin name different from a previous logical pin name which is used before, the circuit-diagram reflecting unit 130 cuts off the line (step S113).

Subsequently, the created symbol is arranged in the circuit diagram by a component input function that is specified by the user (step S114).

In this manner, if a symbol corresponding to FPGA information retrieved by the FPGA-information managing unit 110 is arranged in the circuit diagram, the library creating unit 120 creates a symbol library by referring to the previously-created symbol library, and the circuit-diagram reflecting unit 130 replaces the arranged symbol with a symbol in which the symbol library is newly created. Thus, it is possible to minimize modifications of the circuit diagram due to a change of the FPGA design.

Incidentally, in this case, the library creating unit 120 refers to the previously-created symbol library, if an FPGA subjected to create a symbol library is arranged in the circuit diagram. Alternatively, the library creating unit 120 can refer to the previously-created symbol library, if a symbol library of an FPGA subjected to create the symbol library is stored in the symbol-library storing unit 125.

Figure 14:
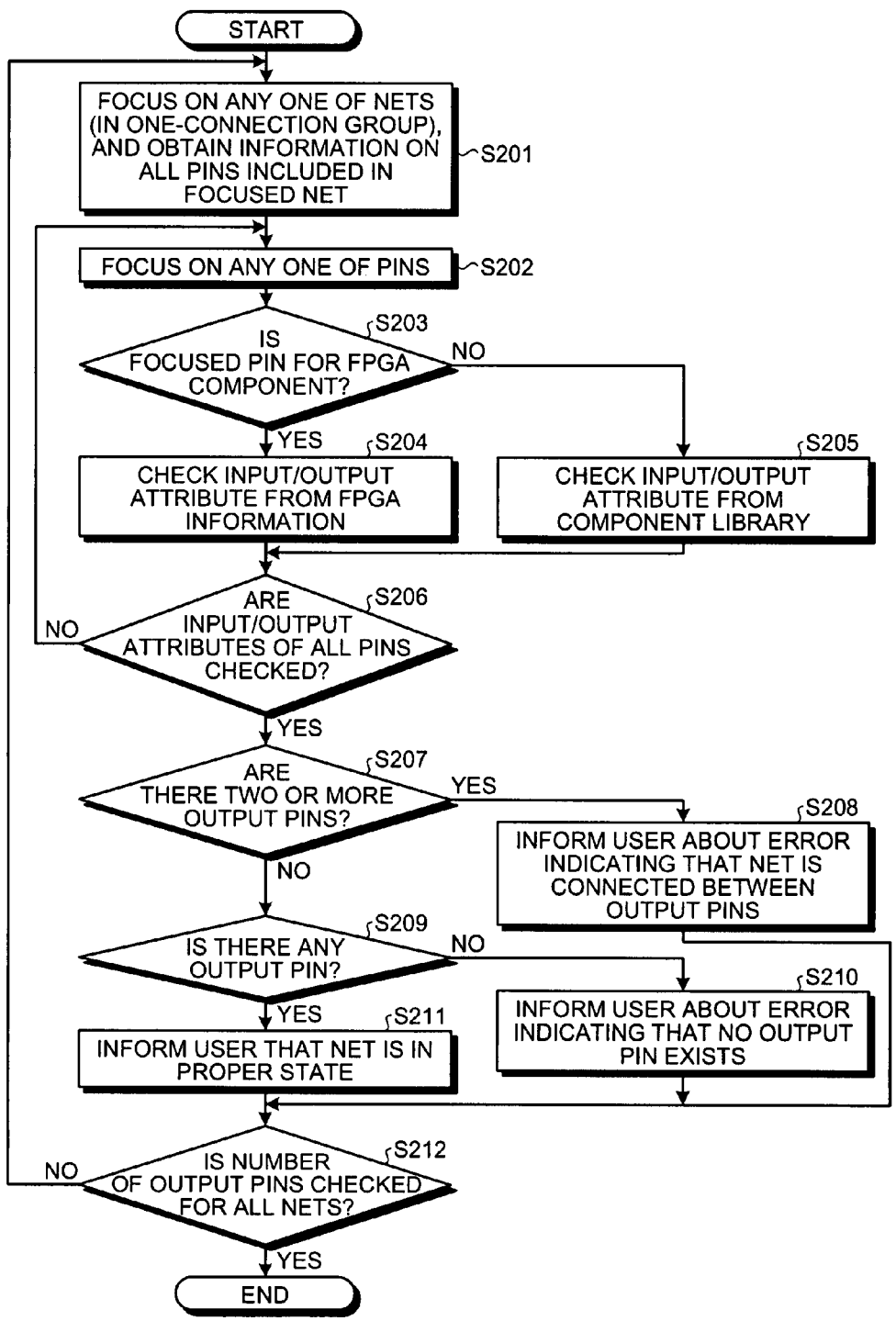
FIG. 14 is a flowchart of a process for checking an input/output attribute, which is performed by a DRC unit.
Figure 15:
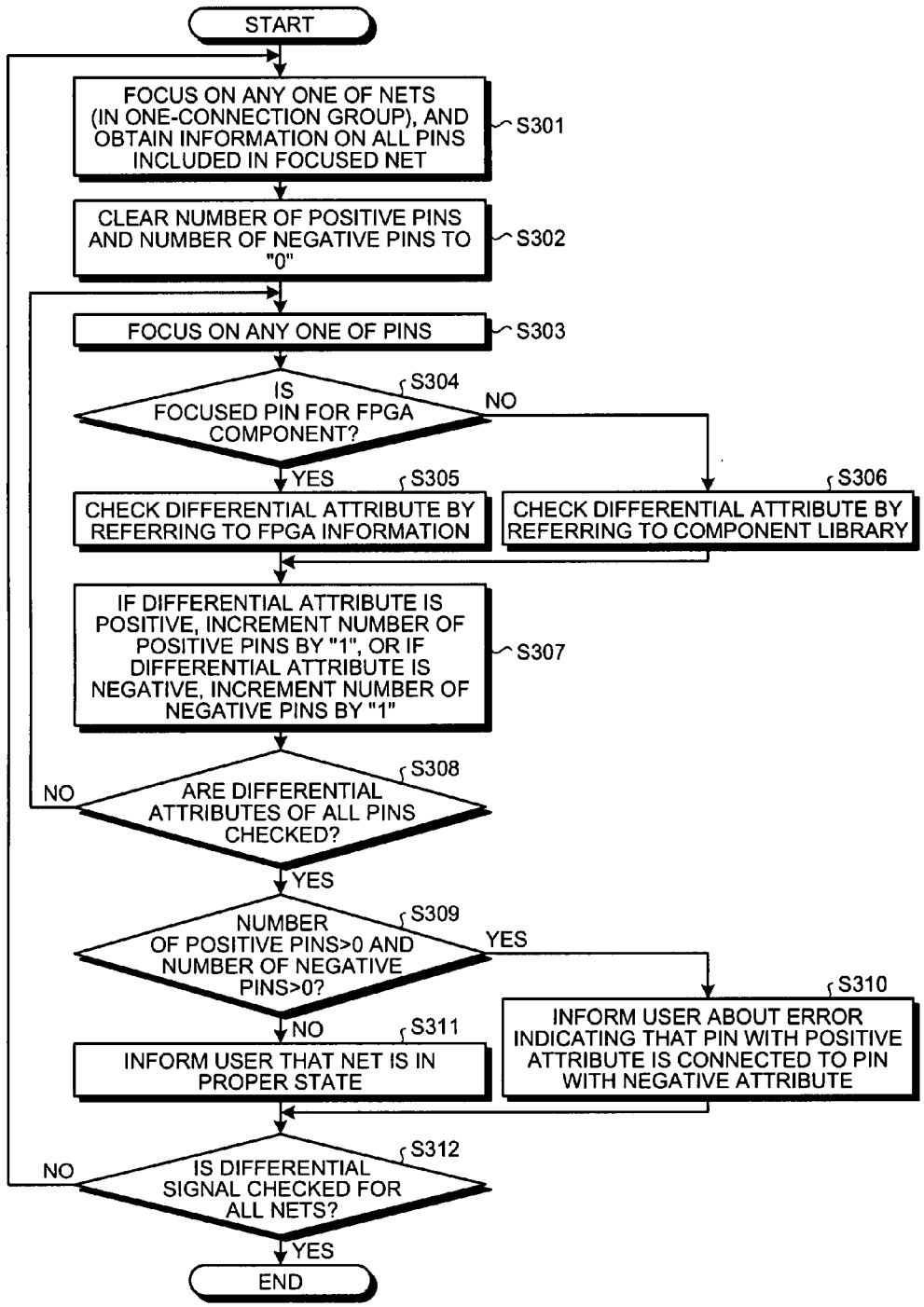
FIG. 15 is a flowchart of a process for checking a differential signal, which is performed by the DRC unit.

Subsequently, a process for checking an input/output attribute, which is performed by the DRC unit 140, is explained. FIG. 14 is a flowchart of the processing procedure of the process of checking an input/output attribute, which is performed by the DRC unit 140.

As shown in the drawing, the DRC unit 140 focuses on any one of nets in a one-connection group, and obtains information on all pins included in the focused net (step S201). Then, the DRC unit 140 focuses on any one of the pins which information is obtained (step S202), and determines whether the focused pin is for an FPGA component (step S203).

As a result, if the focused pin is for an FPGA component, an input/output attribute of the pin is checked by referring to the FPGA information stored in the FPGA-information storing unit 115 (step S204). If the focused pin is not for an FPGA component, an input/output attribute of the pin is checked by referring to the component library 30 (step S205). Then, it is determined whether input/output attributes of all the pins are checked (step S206). If there is any pin that is not checked, the system control returns back to step S202, and a pin that is not checked is focused to check its input/output attribute.

If input/output attributes of all the pins are checked, it is determined whether the focused net includes two or more output pins (step S207). If two or more output pins are included, the user is informed about an error indicating that the net is connected between the output pins (step S208). Also, it is determined whether the focused net does not include any output pin (step S209). If any output pin is not included, the user is informed about an error indicating that no output pin exists in the focused net (step S210). If only one pin is an output pin, the user is informed that the focused net is in a proper state (step S211).

Then, all the nets are determined whether the number of output pins is checked (step S212). If there is any net that the number of output pins is not checked, the system control returns back to step S201, and a net that the number of output pins is not checked is focused to check the number of output pins. If all the nets are determined that the number of output pins is checked, the process of checking an input/output attribute is terminated.

In this manner, as for the FPGA component, the DRC unit 140 checks input/output attributes of pins by referring to the FPGA information, and thus it is possible to precisely check input/output attributes in the circuit including the FPGA.

Subsequently, a process for checking a differential signal, which is performed by the DRC unit 140, is explained. FIG.

15 is a flowchart of the processing procedure of the process of checking a differential signal, which is performed by the DRC unit 140.

As shown in the drawing, the DRC unit 140 focuses on any one of nets, and obtains information on all pins included in the focused net (step S301). Initial values of the number of positive pins, which denotes the number of pins which differential attribute is positive, and the number of negative pins, which denotes the number of pins which differential attribute is negative, are cleared to zero (step S302). Then, any one of the pins which information is obtained is focused (step S303), and it is determined whether the focused pin is for an FPGA component (step S304).

As a result, if the focused pin is for an FPGA component, a differential attribute of the pin is checked by referring to the FPGA information stored in the FPGA-information storing unit 115 (step S305). If the focused pin is not for an FPGA component, a differential attribute of the pin is checked by referring to the component library 30 (step S306). Then, if the differential attribute is positive, the number of positive pins is incremented by "1", or if the differential attribute is negative, the number of negative pins is incremented by "1" (step S307).

It is determined whether differential attributes of all pins are checked (step S308). If there is any pin which differential attribute is not checked, the system control returns back to step S303, and a pin which differential attribute is not checked is focused to check its differential attribute.

If differential attributes of all the pins are checked, it is determined whether the number of positive pins is a plus quantity and also the number of negative pins is a plus quantity, i.e., whether both a pin with a positive attribute and a pin with a negative attribute exist in the focused net (step S309). If the number of positive pins is a plus quantity and also the number of negative pins is a plus quantity, the user is informed about an error indicating that a pin with a positive attribute is connected to a pin with a negative attribute (step S310). If either one of the number of positive pins or the number of negative pins is a plus quantity, the user is informed that the focused net is in a proper state (step S311).

Then, all nets are determined whether a differential signal is checked (step S312). If there is any net that a differential signal is not checked, the system control returns back to step S301, and a net that a differential signal is not checked is focused to check its differential signal. If all nets are determined that differential signal is checked, the process of checking a differential signal is terminated.

In this manner, as for the FPGA component, the DRC unit 140 checks differential attributes of pins by referring to the FPGA information, and thus it is possible to precisely check a differential signal in the circuit including the FPGA.

Figure 16:
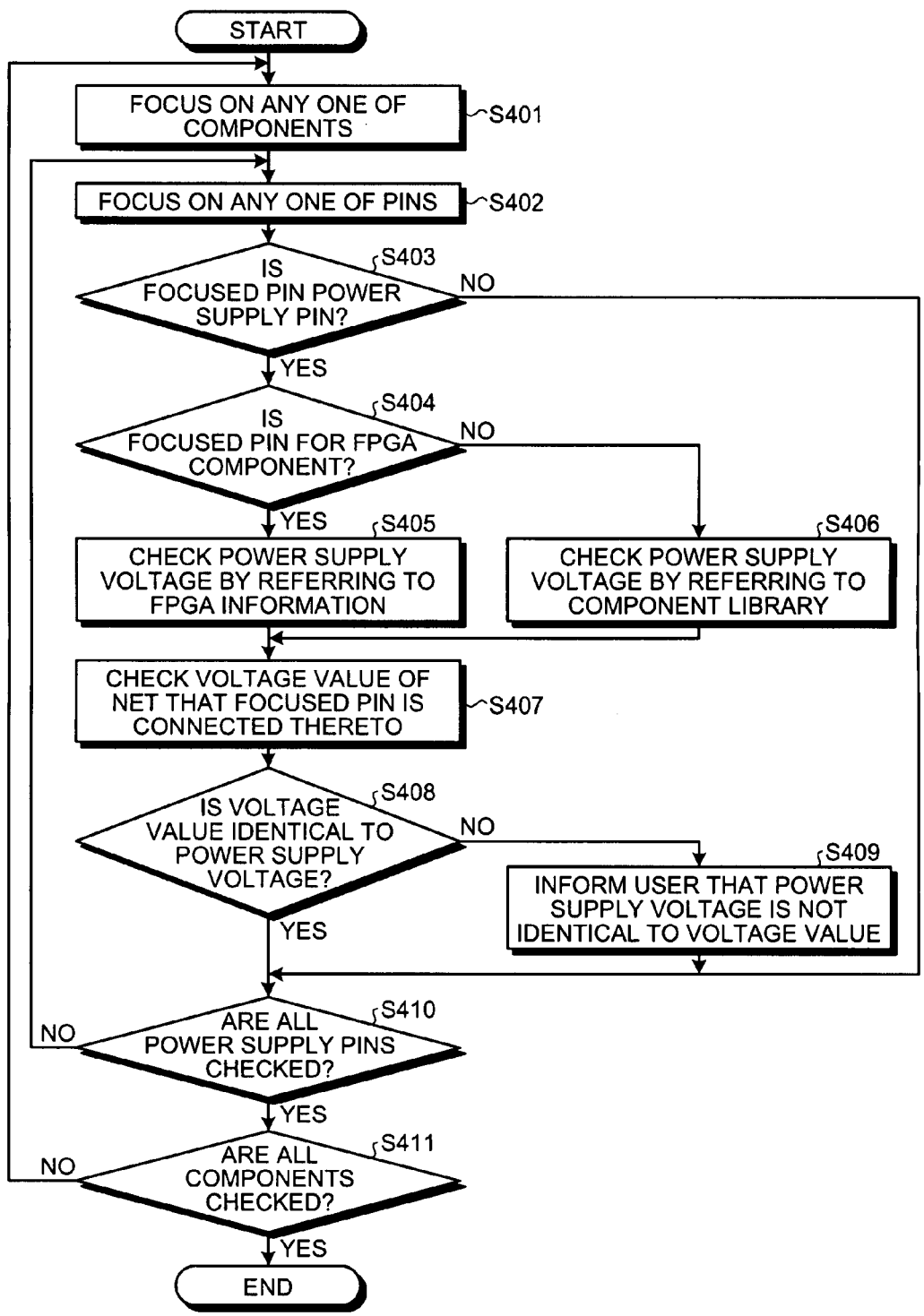
FIG. 16 is a flowchart of a process of checking a power supply voltage, which is performed by the DRC unit.

Subsequently, a process for checking a power supply voltage, which is performed by the DRC unit 140, is explained. FIG. 16 is a flowchart of the processing procedure of the process of checking a power supply voltage, which is performed by the DRC unit 140.

As shown in the drawing, the DRC unit 140 focuses on any one of components (step S401), and further focuses on any one of pins included in the focused component (step S402). Then, it is determined whether the focused pin is a power supply pin (step S403). If the focused pin is not a power supply pin, the system control proceeds to step S410.

If the focused pin is a power supply pin, it is determined whether the focused pin is for an FPGA component (step S404). If the focused pin is for an FPGA component, a power supply voltage of the pin is checked by referring to the FPGA information stored in the FPGA-information storing unit 115 (step S405). If the focused pin is not for an FPGA component, a power supply voltage of the pin is checked by referring to the component library 30 (step S406). Then, a voltage value of a net that the focused pin is connected thereto is checked (step S407), and it is determined whether the voltage value is identical to the power supply voltage of the pin (step S408). If the voltage value is not identical to the power supply voltage of the pin, the user is informed that the power supply voltage is not identical to the voltage value (step S409).

Then, it is determined whether all pins are checked (step S410). If there is any pin that is not checked, the system control returns back to step S402, and a pin that is not checked is focused to check a voltage value of the power supply pin.

If all the pins are checked, all the components are determined whether a power supply voltage is checked (step S411). If there is any component which a power supply voltage is not checked, the system control returns back to step S401, and a component which a power supply voltage is not checked is focused to check a power supply voltage. If all the components are determined that a power supply voltage is checked, the process of checking a power supply voltage is terminated.

In this manner, as for the FPGA component, the DRC unit 140 checks a voltage value of the power supply pin by referring to the FPGA information, and thus it is possible to precisely check a power supply voltage in the circuit including the FPGA.

Figure 17:
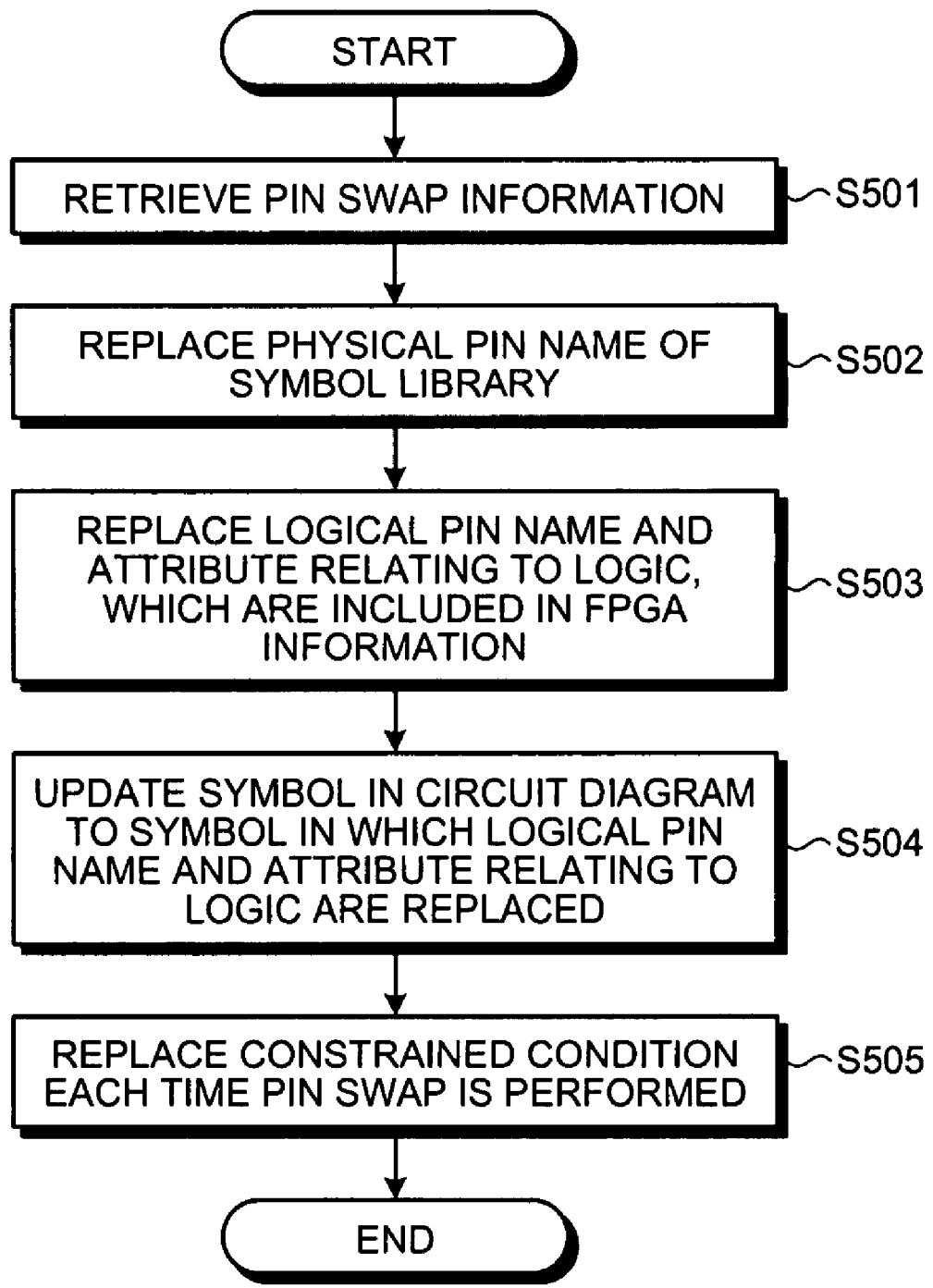
FIG. 17 is a flowchart of a process for pin swapping, which is performed by a pin-swap processing unit.

Subsequently, a process for pin swapping, which is performed by the pin-swap processing unit 150, is explained. FIG. 17 is a flowchart of the processing procedure of the process of pin swapping, which is performed by the pin-swap processing unit 150.

As shown in the drawing, the pin-swap processing unit 150 retrieves pin swap information that is created by the package-designing CAD apparatus 20 (step S501), and replaces a physical pin name of a symbol library of an FPGA in which a pin swap is performed (step S502).

Then, a logical pin name and an attribute relating to a logic, which are included in FPGA information of the FPGA in which the pin swap is performed, are replaced (step S503), and a symbol in the circuit diagram is updated to the symbol in which the logical pin name and the attribute relating to the logic are replaced (step S504). As for a pin having a constrained condition, the constrained condition is replaced each time a pin swap is performed (step S505).

In this manner, as for a pin having a constrained condition, the pin-swap processing unit 150 replaces the constrained condition each time a pin swap is performed, and thus a pin swap in the package-designing CAD can be precisely reflected in information on the circuit design.

Figure 18:
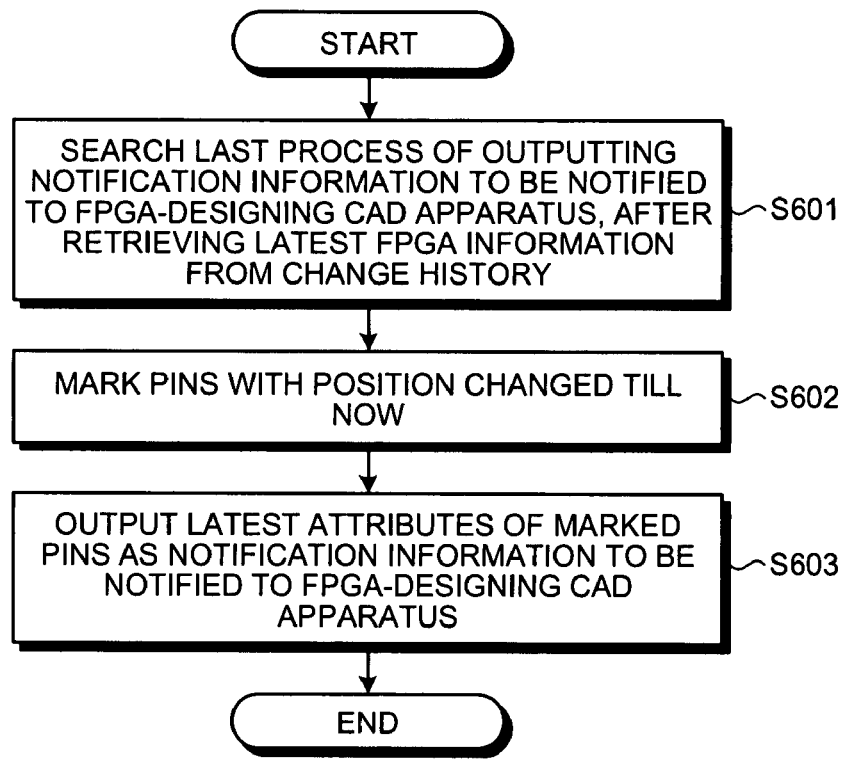
FIG. 18 is a flowchart of a process for outputting a change history, which is performed by the history output unit.

Subsequently, a process for outputting a change history, which is performed by the history output unit 160, is explained. FIG. 18 is a flowchart of the processing procedure of the process of outputting a change history, which is performed by the history output unit 160. As shown in the drawing, after retrieving the latest FPGA information from a change history stored in the change-history storing unit 165, the history output unit 160 searches the last process of outputting notification information to be notified to the FPGA-designing CAD apparatus 10 (step S601).

Then, pins subjected to perform a pin swap during from the last process of outputting notification information till now are marked (step S602). The latest attributes of the marked pins are output as notification information to be notified to the FPGA-designing CAD apparatus 10 (step S603).

Namely, after the FPGA-information managing unit 110 retrieves the FPGA information from the FPGA-designing CAD apparatus 10 and updates the FPGA information stored in the FPGA-information storing unit 115, the history output unit 160 outputs the latest attributes of the pins subjected to perform a pin swap, which are not notified yet, as notification information.

In this manner, the history output unit 160 outputs the latest attributes of pins subjected to perform a pin swap as notification information to the FPGA-designing CAD apparatus 10 by using the change history stored in the change-history storing unit 165, and thus the pin swap in the package design can be reflected in the FPGA design information.

Furthermore, after the FPGA-information managing unit 110 retrieves the FPGA information from the FPGA-designing CAD apparatus 10 and updates the FPGA information stored in the FPGA-information storing unit 115, the latest attributes of pins only subjected to perform a pin swap, which are not notified yet, are output as notification information. As a result, it is possible to avoid outputting wasted notification information or overlapping notification information, and thus the pin swap in the package design can be efficiently reflected in the FPGA design information.

As described above, in the first embodiment, the FPGA-information managing unit 110 included in the circuit-designing CAD apparatus 100 retrieves FPGA information, such as pin assignment information and attribute information, which is created by the FPGA-designing CAD apparatus 10, and the library creating unit 120 creates a symbol library by using the FPGA information. Therefore, the circuit designer needs not create the symbol library of the FPGA, and thus it is possible to reduce workloads on the circuit designer.

Furthermore, at the time of creating a symbol library, if an FPGA subjected to create a symbol library is arranged in the circuit diagram, the library creating unit 120 manages not to change a portion assignment and a pin layout of the existing symbol library arranged in the circuit diagram as much as possible. Also, when the circuit-diagram reflecting unit 130 arranges a symbol of an FPGA that a symbol library is newly created in the circuit diagram, the symbol is arranged without changing the existing layout. Thus, it is possible to minimize modifications of the circuit diagram due to a change of the FPGA design.

Furthermore, in the first embodiment, when the DRC unit 140 included in the circuit-designing CAD apparatus 100 performs a DRC, as for an FPGA, an attribute of a pin and the like are checked by referring to the FPGA information that is retrieved from the FPGA-designing CAD apparatus 10 and stored in the FPGA-information storing unit 115 by the FPGA-information managing unit 110. Thus, it is possible to perform the DRC precisely.

Furthermore, in the first embodiment, the pin-swap processing unit 150 included in the circuit-designing CAD apparatus 100 retrieves pin swap information from the package-designing CAD apparatus 20, and reflects the pin swap in the constrained condition in addition to the symbol library, the FPGA information, and the circuit diagram. Thus, it is possible to eliminate an inconsistency of design information between the circuit design and the package design.

Furthermore, in the first embodiment, the change-history storing unit 165 included in the circuit-designing CAD apparatus 100 stores therein a change history of the FPGA information, and the history output unit 160 outputs information for notifying the pin swap to the FPGA-designing CAD apparatus 10 based on the change history stored in the change-history storing unit 165. Thus, it is possible to ensure a consistency of design information among the package design, the circuit design, and the FPGA design.

In the first embodiment, a case has been considered in which a package design of a printed circuit board is made based on a result of designing a circuit by using an FPGA component. To consider a desirable pin assignment for both the FPGA designer and the package designer in advance contributes greatly to shortening a period of designing. Consequently, in a second embodiment of the present invention, there is explained an FPGA coordinated design system that supports a coordinated design made between the FPGA designer and the package designer.

Figure 19:
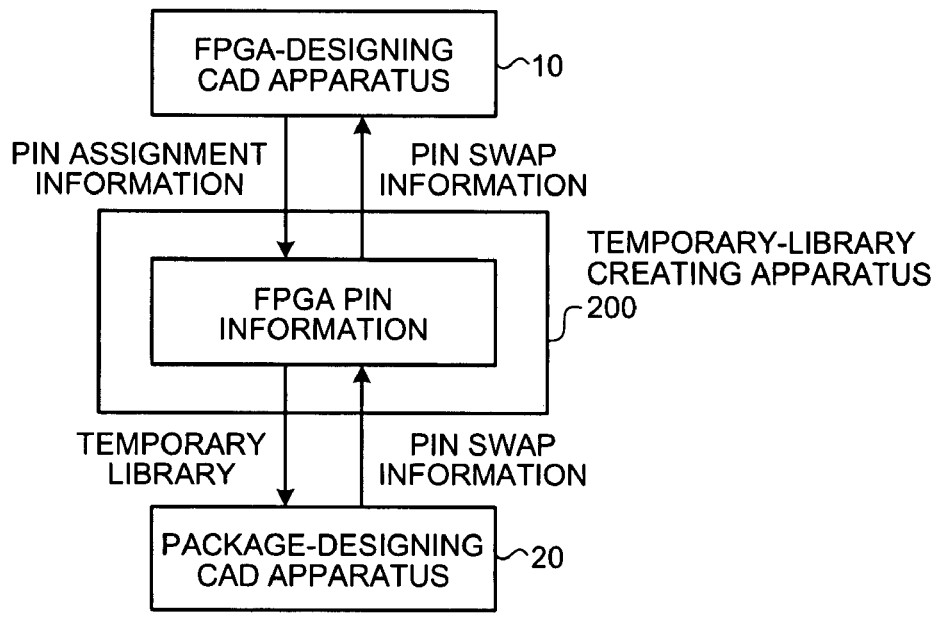
FIG. 19 is an explanatory diagram for explaining the concept of an FPGA coordinated design according to a second embodiment of the present invention.

First, a concept of an FPGA coordinated design according to the second embodiment is explained. FIG. 19 is an explanatory diagram for explaining the concept of the FPGA coordinated design according to the second embodiment. As shown in the drawing, in the FPGA coordinated design according to the second embodiment, a temporary-library creating apparatus 200 as a coordinated-design supporting apparatus receives FPGA pin information, such as pin assignment information, which is created by the FPGA-designing CAD apparatus 10, and creates a temporary library of an FPGA. In this case, the temporary library denotes a component shape type library that is required when the package-designing CAD apparatus 20 performs a pin assignment, and is a temporarily-created library with respect to the FPGA.

The temporary-library creating apparatus 200 retrieves pin swap information from the package-designing CAD apparatus 20, and reflects the retrieved pin swap information in FPGA information that is managed by its own self, and also notifies the pin swap information to the FPGA-designing CAD apparatus 10.

In this manner, in the second embodiment, the temporary-library creating apparatus 200 receives the FPGA pin information that is created by the FPGA-designing CAD apparatus 10, and creates a temporary component shape type library with respect to the FPGA. Thus, it is possible to consider a pin assignment by using the package-designing CAD apparatus 20.

Figure 20:
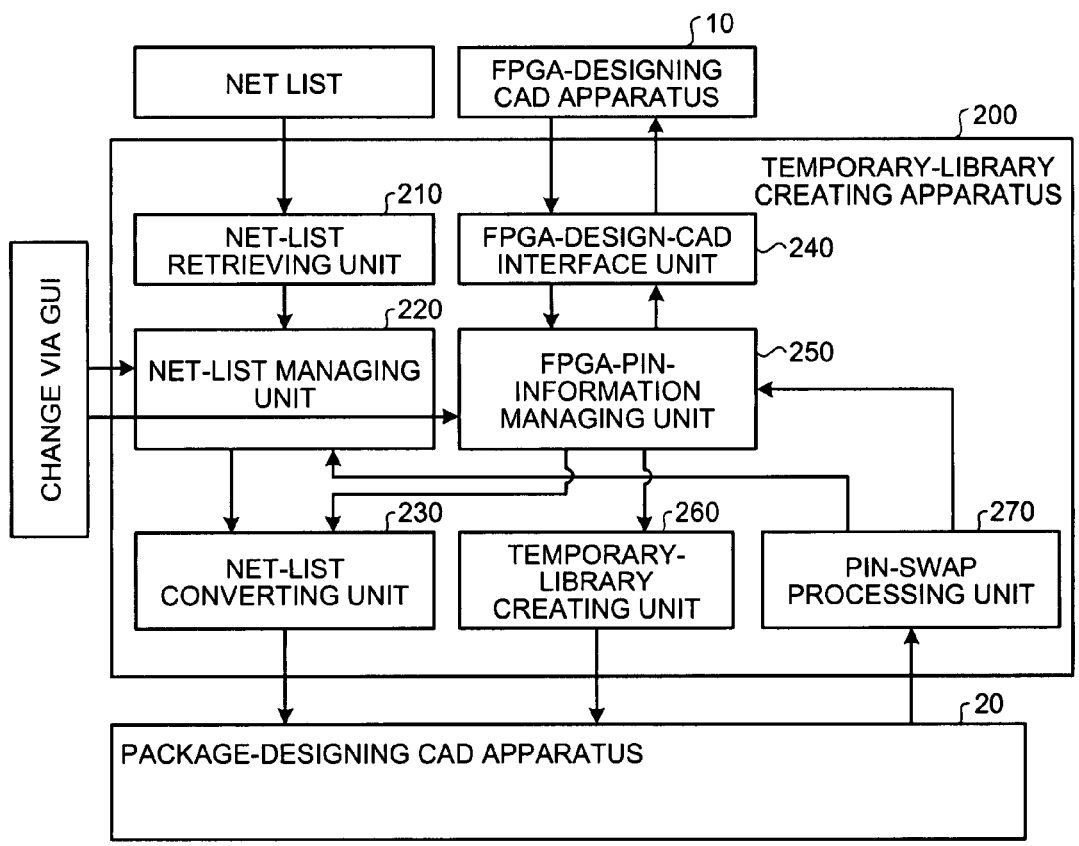
FIG. 20 is a functional block diagram of an FPGA coordinated design system according to the second embodiment.

Subsequently, a configuration of the FPGA coordinated design system according to the second embodiment is explained. FIG. 20 is a functional block diagram of the configuration of the FPGA coordinated design system according to the second embodiment. As shown in the drawing, the FPGA coordinated design system includes the FPGA-designing CAD apparatus 10, the package-designing CAD apparatus 20, and the temporary-library creating apparatus 200. The temporary-library creating apparatus 200 includes a net-list retrieving unit 210, a net-list managing unit 220, a net-list converting unit 230, an FPGA-design-CAD interface unit 240, an FPGA-pin-information managing unit 250, a temporary-library creating unit 260, and a pin-swap processing unit 270.

The net-list retrieving unit 210 is a processing unit that retrieves a net list created by the user and passes the net list to the net-list managing unit 220. FIG. 21 is a diagram of an example of a net list retrieved by the net-list retrieving unit 210.

As shown in the drawing, the net list includes a component defining unit that defines a component and a net defining unit that defines a net. In the component defining unit, a component name and a component library name are described with respect to a component used for consideration. However, as for an FPGA component, there is no component library, so that a module name (a name for distinguishing an FPGA) is described followed by "FPGA/".

In the net defining unit, a net name and a component pin connected to the net are described with respect to each of nets. In this case, the component pin is described in the form of "(a component name).(a component pin name)". Incidentally, as for an FPGA component, a logical pin name or a physical pin name is described as a pin name (the physical pin name is marked with "%").

The net-list managing unit 220 is a managing unit that stores therein and manages the net list retrieved by the net-list retrieving unit 210. Upon receiving a change of the net list input by the user via the GUI, the net-list managing unit 220 changes the net list.

The net-list converting unit 230 is a processing unit that converts the net list managed by the net-list managing unit 220 into a format capable of inputting to the package-designing CAD apparatus 20. The net-list converting unit 230 refers to FPGA information managed by the FPGA-pin-information managing unit 250 upon the conversion of the net list.

Figure 22:
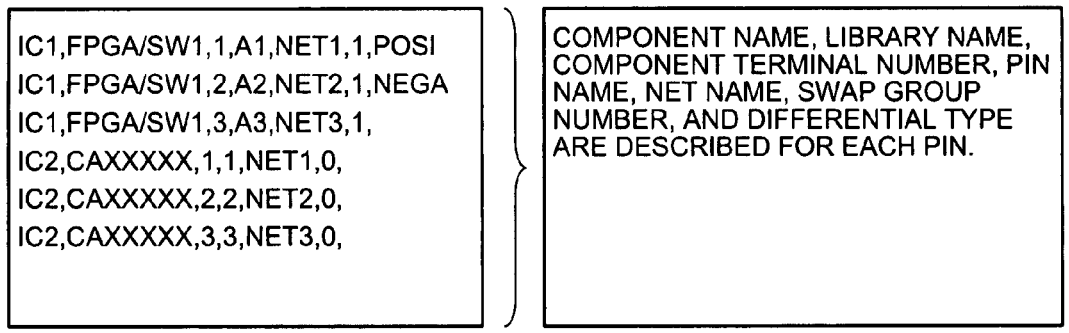
FIG. 22 is a diagram of an example of a net list output by a net-list converting unit.

FIG. 22 is a diagram of an example of a net list output by the net-list converting unit 230. As shown in the drawing, the net list includes a component name, a library name, a component terminal number, a pin name, a net name, a swap group number, and a differential type with respect to each of pins. In this case, the component terminal number is a consecutive number assigned to each of pins.

The FPGA-design-CAD interface unit 240 is an interface to the FPGA-designing CAD apparatus 10. Specifically, the FPGA-design-CAD interface unit 240 retrieves FPGA pin information from the FPGA-designing CAD apparatus 10, and provides pin swap information to the FPGA-designing CAD apparatus 10.

The FPGA-pin-information managing unit 250 is a managing unit that stores therein and manages FPGA pin information retrieved by the FPGA-design-CAD interface unit 240. Furthermore, upon receiving an instruction for changing a pin interval or FPGA pin information from the user via the GUI, the FPGA-pin-information managing unit 250 changes the FPGA information.

The temporary-library creating unit 260 is a processing unit that creates a temporary library, i.e., a temporary component shape type library by using FPGA pin information managed by the FPGA-pin-information managing unit 250 with respect to an FPGA component.

Figure 23:
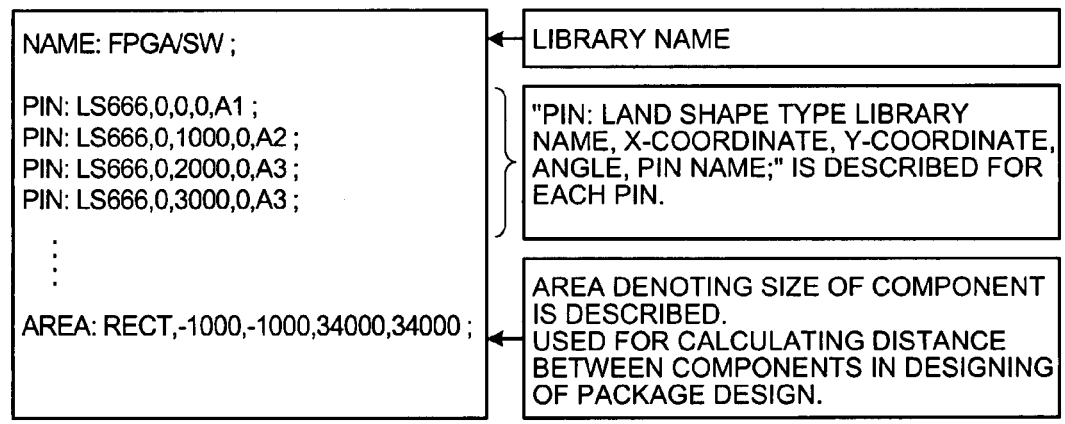
FIG. 23 is a diagram of an example of a temporary library created by a temporary-library creating unit.

FIG. 23 is a diagram of an example of a temporary library created by the temporary-library creating unit 260. As shown in the drawing, in the temporary library, there is described a land shape type library name, an X-coordinate, a Y-coordinate, an angle, and a pin name with respect to each of pins. Incidentally, as for the land shape type library name, information stored in the FPGA-pin-information managing unit 250 upon receiving an instruction from the user is used.

Furthermore, in the temporary library, an area denoting a size of a component is also described. Information on the area is used to calculate a distance between components in designing the package design. Incidentally, a size of a component is calculated by the temporary-library creating unit 260 based on a pin interval.

The temporary-library creating unit 260 creates a temporary library based on FPGA pin information, and thus it is possible to consider a pin assignment in the package-designing CAD.

The pin-swap processing unit 270 is a processing unit that retrieves pin swap information from the package-designing CAD apparatus 20 and instructs the FPGA-pin-information managing unit 250 to change FPGA pin information. The FPGA-pin-information managing unit 250 changes the FPGA pin information, and also instructs the FPGA-design-CAD interface unit 240 to notify the pin swap information to the FPGA-designing CAD apparatus 10. Furthermore, the pin-swap processing unit 270 instructs the net-list managing unit 220 to change a net list based on the pin swap information.

Figure 24:
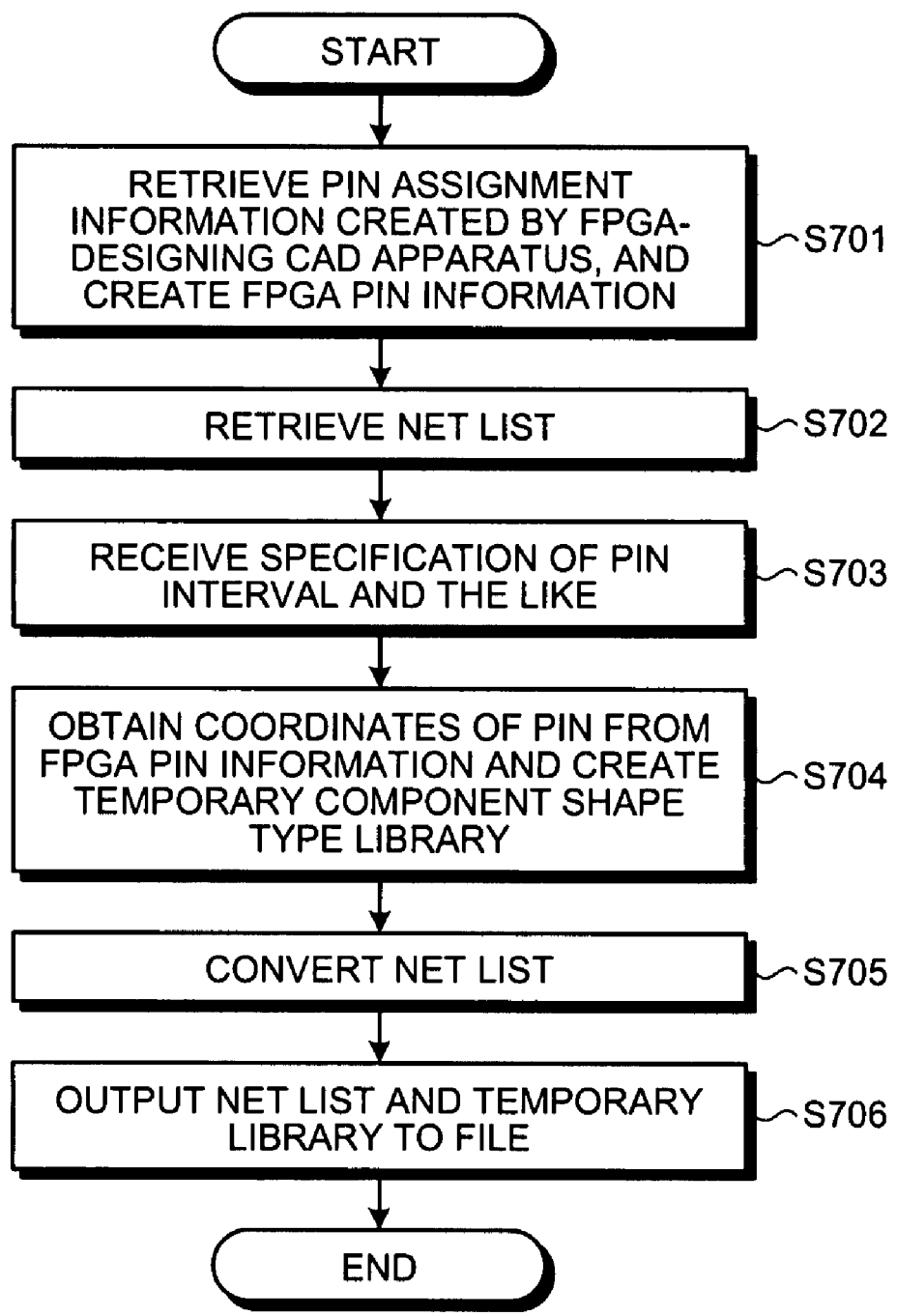
FIG. 24 is a flowchart of a process for outputting information for a package-designing CAD, which is performed by a temporary-library creating apparatus.

Subsequently, a process for outputting information for package-designing CAD, which is performed by the temporary-library creating apparatus 200, is explained. FIG. 24 is a flowchart of the processing procedure of the process of outputting information for package-designing CAD, which is performed by the temporary-library creating apparatus 200.

As shown in the drawing, in the temporary-library creating apparatus 200, the FPGA-design-CAD interface unit 240 retrieves pin assignment information created by the FPGA-designing CAD apparatus 10 and passes the pin assignment information to the FPGA-pin-information managing unit 250, and then the FPGA-pin-information managing unit 250 creates FPGA pin information (step S701).

Furthermore, the net-list retrieving unit 210 retrieves a net list (step S702), and passes the net list to the net-list managing unit 220. When receiving an instruction for changing the net list and the like from the user, the net-list managing unit 220 changes the net list managed by its own self. When receiving a specification of a pin interval and the like from the user (step S703), the FPGA-pin-information managing unit 250 changes the FPGA pin information managed by its own self.

Then, the temporary-library creating unit 260 obtains coordinates of a pin from the FPGA pin information and creates a temporary component shape type library (step S704), and the net-list converting unit 230 converts the net list (step S705). Then, the net-list converting unit 230 outputs the converted net list to a file, and the temporary-library creating unit 260 outputs the created temporary library to the file (step S706).

In this manner, the temporary-library creating apparatus 200 creates the temporary library, and thus it is possible to consider a pin assignment by using the package-designing CAD apparatus 20. Furthermore, upon receiving a specification of a pin interval and the like from the user, the FPGA-pin-information managing unit 250 changes the FPGA pin information managed by its own self. Thus, the user can consider a pin assignment at various pin intervals.

Figure 25:
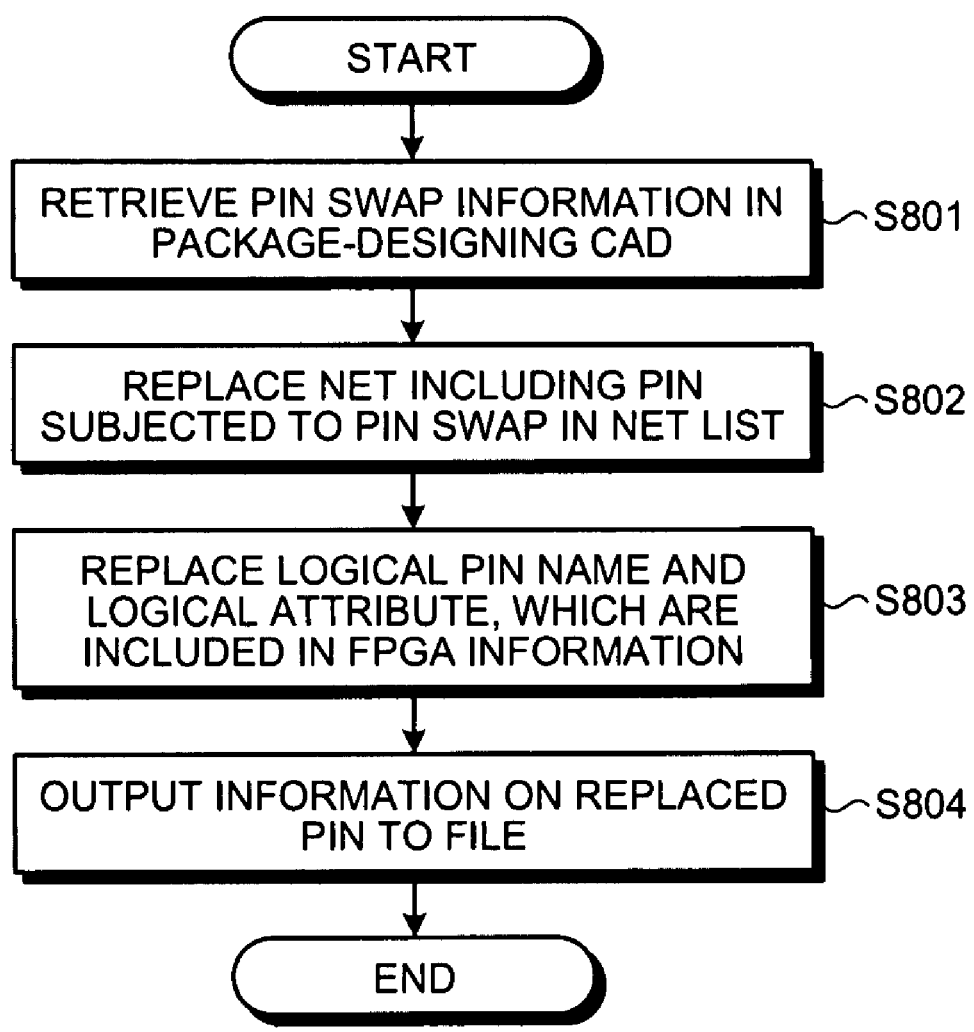
FIG. 25 is a flowchart of a process for reflecting a consideration result of a package, which is performed by the temporary-library creating apparatus.

Subsequently, a process for reflecting a consideration result of a package, which is performed by the temporary-library creating apparatus 200, is explained. FIG. 25 is a flowchart of the processing procedure of the process of reflecting a consideration result of a package, which is performed by the temporary-library creating apparatus 200.

As shown in the drawing, in the temporary-library creating apparatus 200, the pin-swap processing unit 270 retrieves pin swap information in the package-designing CAD (step S801), and replaces a net including a pin subjected to pin swap in the net list (step S802).

Then, the pin-swap processing unit 270 replaces a logical pin name and a logical attribute, which are included in FPGA information (step S803), and the FPGA-design-CAD interface unit 240 outputs information on the replaced pin to a file (step S804).

In this manner, the pin-swap processing unit 270 retrieves the pin swap information in the package-designing CAD, and reflects the pin swap in the net list and the FPGA pin information. And then, the FPGA-design-CAD interface unit 240 outputs information on the pin swap to the file. Thus, the pin swap in the package design can be reflected in the FPGA design information.

As described above, in the second embodiment, the FPGA-design-CAD interface unit 240 retrieves pin assignment information created by the FPGA-designing CAD apparatus 10, and the FPGA-pin-information managing unit 250 manages the pin assignment information retrieved by the FPGAdesign-CAD interface unit 240 as FPGA pin information, and the temporary-library creating unit 260 creates a temporary component shape type library by using the FPGA pin information managed by the FPGA-pin-information managing unit 250 and outputs the temporary component shape type library in the form capable of being read by the package-designing CAD apparatus 20 to the file. Thus, it is possible to consider an early pin assignment by using the package-designing CAD apparatus 20, and also to shorten a period of designing a printed circuit board.

The circuit-designing CAD apparatus and the temporary-library creating apparatus are respectively explained in the first and second embodiments. Alternatively, it is also possible to achieve a circuit-designing CAD program and a temporary-library creating program, which respectively have the same function as the circuit-designing CAD apparatus and the temporary-library creating apparatus, by realizing structures of the circuit-designing CAD apparatus and the temporary-library creating apparatus with software. Consequently, a computer that performs the circuit-designing CAD program is explained below. Incidentally, the temporary-library creating program can be also performed by a similar computer.

Figure 26:
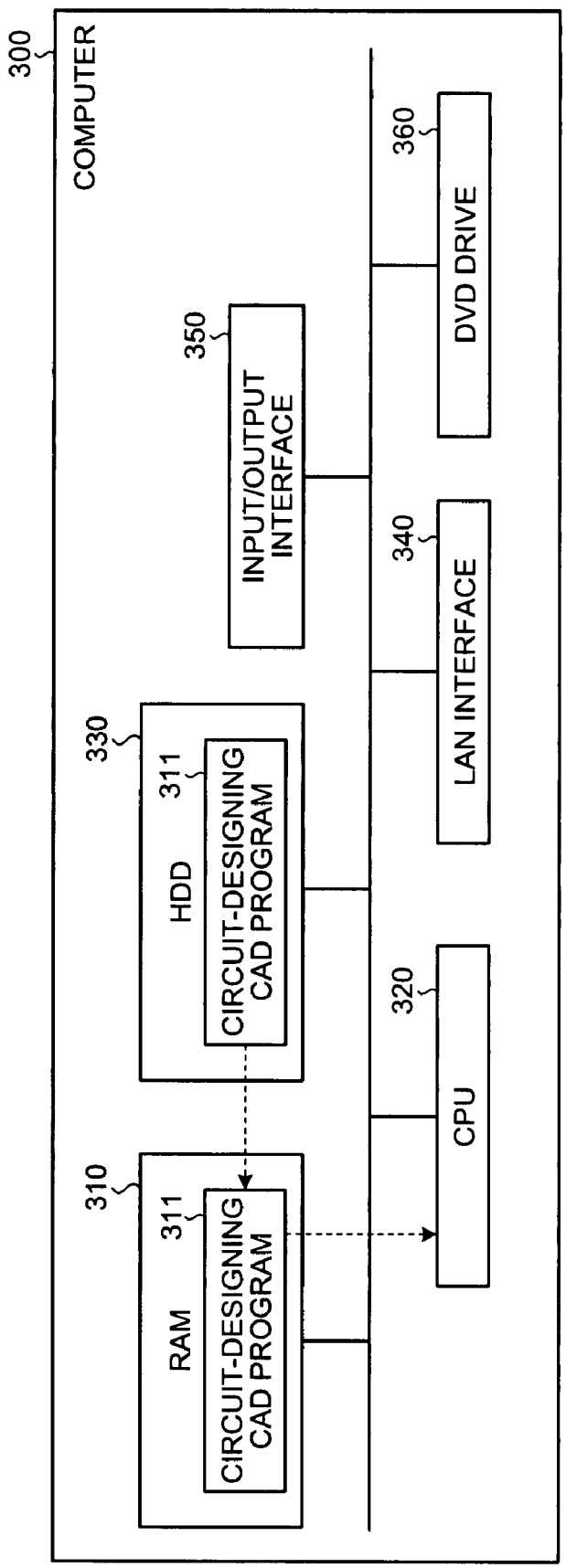
FIG. 26 is a functional block diagram of a computer that performs a circuit-designing CAD program according to the first embodiment.

FIG. 26 is a functional block diagram of a computer 300 that performs the circuit-designing CAD program according to the first embodiment. As shown in the drawing, the computer 300 includes a RAM 310, a CPU 320, an HDD 330, a LAN interface 340, an input/output interface 350, and a DVD drive 360.

The RAM 310 is a memory that stores therein a computer program, an intermediate result of executing the computer program, and the like. The CPU 320 is a central processing unit that reads a program from the RAM 310 and performs the program. The HDD 330 is a disk device that stores therein a program and data. The LAN interface 340 is an interface for connecting the computer 300 to other computers via a LAN. The input/output interface 350 is an interface for connecting the computer 300 to an input device, such as a mouse or a keyboard, and a display device. The DVD drive 360 is a device that reads/writes a DVD.

A circuit-designing CAD program 311 to be performed by the computer 300 is stored in a DVD, and read out from the DVD by the DVD drive 360, and then installed on the computer 300. Alternatively, the circuit-designing CAD program 311 is stored in, for example, a database of other computer system that is connected to the computer 300 via the LAN interface 340, and read out from the database, and then installed on the computer 300. Then, the installed circuit-designing CAD program 311 is stored in the HDD 330, and read out by the RAM 310, and then performed by the CPU 320.

In the present embodiments, a case in which an FPGA is used as a component is explained. However, the present invention is not limited to the above case. The present invention can also be applied to a case in which a PLD is generally used as a component. Moreover, the present invention can also be applied to a case in which a design of a component other than the PLD, such as a application specific integrated circuit (ASIC), is carried on in parallel with a circuit design and a package design, and particularly, widely applied to a case in which an integrated circuit is used as a component.

According to an aspect of the invention, it is possible to consider an early pin assignment by using a package-designing CAD apparatus. Thus, it is possible to shorten a period of designing a printed circuit board.

According to another aspect of the invention, necessary information is provided to the package-designing CAD apparatus. Thus, it is possible to consider a pin assignment by using the package-designing CAD apparatus.

According to still another aspect of the invention, the package-designing CAD apparatus can calculate a distance between components. Thus, it is possible to consider a pin assignment based on the distance between components.

According to still another aspect of the invention, a pin swap is reflected in integrated circuit design information. Thus, it is easy to ensure a consistency of package design information and integrated circuit design information.

According to still another aspect of the invention, a net list is provided to the package-designing CAD apparatus. Thus, it is possible to consider a pin assignment based on a connection of a net between component pins.

According to still another aspect of the invention, a net list required by the package-designing CAD apparatus is created based on a net list that a user can easily write thereon. Thus, it is possible to reduce workloads of the user.

According to still another aspect of the invention, the user can consider a pin assignment by changing a pin interval. Thus, it is possible to consider various pin assignments.

According to still another aspect of the invention, it is possible to create a symbol library by using information on a symbol arranged in a circuit diagram. Thus, it is possible to reduce modifications of the circuit diagram due to a design change of an integrated circuit.

According to still another aspect of the invention, when a design of a PLD arranged in the circuit diagram is changed, it is possible to reduce changes of the symbol. Thus, it is possible to reduce modifications of the circuit diagram due to a design change of the PLD, and thereby improving an efficiency of designing a circuit.

According to still another aspect of the invention, when a design of the PLD arranged in the circuit diagram is changed, a circuit designer needs not replace the symbol in the circuit diagram. Thus, it is possible to reduce modifications of the circuit diagram due to a design change of the PLD, and thereby improving an efficiency of designing a circuit.

According to still another aspect of the invention, it is possible to avoid missing a modification of the circuit diagram due to a design change of the PLD. Thus, it is possible to improve a quality of the design.

According to still another aspect of the invention, as for in an integrated circuit, a design rule check is performed by using a final pin attribute when the integrated circuit is packaged, and thus the design rule check can be performed precisely.

According to still another aspect of the invention, as for in a PLD, an input/output attribute check is performed by using an input/output attribute that is obtained after a program is written, and thus the input/output attribute check can be performed precisely.

According to still another aspect of the invention, as for in the PLD, a differential signal check is performed by using a differential attribute that is obtained after a program is written, and thus the differential signal check can be performed precisely.

According to still another aspect of the invention, as for in the PLD, a power-supply voltage check is performed by using a power supply voltage that is obtained after a program is written, and thus the power-supply voltage check can be performed precisely.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

According to still another aspect of the invention, a change in a package design is reflected in circuit design information, and thus it can be easy to ensure a consistency of circuit design information and package design information.

According to still another aspect of the invention, a change in the package design is reflected in a circuit diagram as well as a symbol library, and thus it can be easier to ensure the consistency of the circuit design information and the package design information.

According to still another aspect of the invention, a pin swap can be reflected in the symbol library, and thus it is possible to ensure a consistency of the symbol library and the package design information.

According to still another aspect of the invention, a change in the package design is also reflected in a constrained condition, and thus it can be easier to ensure the consistency of the circuit design information and the package design information.

According to still another aspect of the invention, a pin swap is reflected in a constraint on a length of a line between pins, and thus it can be easier to ensure the consistency of the circuit design information and the package design information.

According to still another aspect of the invention, a change in the package design is also reflected in the stored PLD information, and thus it can be easier to ensure the consistency of the circuit design information and the package design information.

According to still another aspect of the invention, a change in a package design is reflected in circuit design information and integrated circuit design information, and thus it can be easy to ensure a consistency among the circuit design information, the integrated circuit design information, and package design information.

According to still another aspect of the invention, wasted notification information is prevented from being output, and thus a pin swap in the package design can be efficiently reflected in the integrated circuit design information.

According to still another aspect of the invention, notification information is output based on the stored integrated circuit information, and thus it can be easy to ensure the consistency among the integrated circuit information included in the circuit design information, the integrated circuit design information, and the package design information.

According to still another aspect of the invention, overlapping notification information is prevented from being output, and thus a pin swap in the package design can be efficiently reflected in the integrated circuit design information.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A circuit-design supporting apparatus that supports designing a circuit in which an integrated circuit is used as a component, the circuit-design supporting apparatus comprising:
    an integrated circuit-information receiving unit that receives integrated circuit information, which is design information created by using an integrated circuit-designing CAD with respect to the integrated circuit; and
    a library creating unit that creates a symbol library of the integrated circuit to be used in a circuit design by using the integrated circuit information, the symbol library being a library defining a symbol of the integrated circuit, the library creating unit determining whether an existing symbol of the integrated circuit is arranged in a circuit diagram, and creating, if it is determined that the existing symbol is arranged in the circuit diagram, the symbol library based on information on an existing symbol library of the existing symbol, changes from the existing symbol to a symbol, whose symbol library is created, being fewest.

2. The circuit-design supporting apparatus according to claim 1, wherein the library creating unit implements a portion assignment, if the existing symbol of the integrated circuit is arranged in the circuit diagram, based on the information on the existing symbol library corresponding to the existing symbol arranged in the circuit diagram.

3. The circuit-design supporting apparatus according to claim 1, wherein if the existing symbol of the integrated circuit is arranged in the circuit diagram, the library creating unit assigns a logical pin included in the symbol whose symbol library is created to a same portion as a portion where the existing symbol arranged in the circuit diagram is located.

4. The circuit-design supporting apparatus according to claim 3, wherein if the existing symbol of the integrated circuit is arranged in the circuit diagram, the library creating unit arranges the logical pin, which is included in the symbol whose symbol library is created, in a same position as a position where the existing symbol arranged in the circuit diagram is located.

5. A circuit-design supporting apparatus that supports designing a circuit in which an integrated circuit is used as a component, the circuit-design supporting apparatus comprising:
    an integrated circuit-information receiving unit that receives integrated circuit information, which is design information, including a pin attribute created by using an integrated circuit-designing CAD with respect to an integrated circuit used in a circuit;
    a determining unit that determines whether a component used in the circuit is the integrated circuit, the integrated circuit information of the integrated circuit being received by the integrated circuit-information receiving unit;
    an obtaining unit that obtains a pin attribute of the component from the integrated circuit information if the determining unit determines that the component is the integrated circuit, and obtains a pin attribute of the component from a component library if the determining unit determines that the component is not the integrated circuit; and
    a DRC unit that performs a design rule check on the circuit by using the pin attribute obtained by the obtaining unit.

6. The circuit-design supporting apparatus according to claim 5, wherein the integrated circuit information includes an input/output attribute of a pin, and the DRC unit performs an input/output attribute check as the design rule check by using the input/output attribute of the pin.

7. The circuit-design supporting apparatus according to claim 5, wherein the integrated circuit information includes a differential attribute of a pin, and the DRC unit performs a differential signal check as the design rule check by using the differential attribute of the pin.

8. The circuit-design supporting apparatus according to claim 5, wherein the integrated circuit information includes a power supply voltage of a pin, and the DRC unit performs a power-supply voltage check as the design rule check by using the power supply voltage of the pin.

9. A circuit-design supporting apparatus that supports designing a circuit of a printed circuit board in which an integrated circuit is used as a component, the circuit-design supporting apparatus comprising:
- a pin-swap-information receiving unit that receives pin swap information with respect to the integrated circuit from a package-designing CAD apparatus that performs a pin swap in package design of the printed circuit board and produces the pin swap information that is information on the pin swap;
- a pin-swap processing unit that updates a diagram of the circuit and reflects the pin swap into a constrained condition on circuit design by using the pin swap information;
- an integrated circuit-information receiving unit that receives integrated circuit information, which is design information created by using an integrated circuit-designing CAD with respect to the integrated circuit; and
- a library creating unit that creates a symbol library of the integrated circuit to be used in a circuit design by using the integrated circuit information, wherein
- the pin-swap processing unit updates the symbol library created by the library creating unit with the pin swap information, and reflects the pin swap in the circuit diagram by updating a symbol in the circuit diagram with updated symbol library.

10. The circuit-design supporting apparatus according to claim 9, wherein the pin-swap processing unit updates the symbol library by replacing a physical pin name of the symbol library based on the pin swap information.

11. The circuit-design supporting apparatus according to claim 9, further comprising:
- a change-history outputting unit that outputs notification information to be notified to an integrated circuit-design supporting apparatus to reflect the pin swap in integrated circuit design information held by the integrated circuit-design supporting apparatus based on the record of the change history of the integrated circuit information.

12. The circuit-design supporting apparatus according to claim 11, wherein when a plurality of pin swaps is performed with respect to a single pin, the change-history outputting unit outputs the notification information based on pin swap information on a most recently performed pin-swap.

13. The circuit-design supporting apparatus according to claim 11, further comprising an integrated circuit-information storing unit that stores therein design information, which is created by using an integrated circuit-designing CAD with respect to the integrated circuit, as the integrated circuit information, wherein
- the pin-swap processing unit keeps a record of the change history of the integrated circuit information stored in the integrated circuit-information storing unit.

* * * * *

UNITED STATES PATENT AND TRADEMARK OFFICE
CERTIFICATE OF CORRECTION

| | |
|---|---|
| PATENT NO. | : 8,255,844 B2 |
| APPLICATION NO. | : 11/987811 |
| DATED | : August 28, 2012 |
| INVENTOR(S) | : Yoshiyuki Kato et al. |

It is certified that error appears in the above-identified patent and that said Letters Patent is hereby corrected as shown below:

Column 20, Line 18, In Claim 3, delete "claim 1," and insert -- claim 2, --, therefor.

Signed and Sealed this
Eleventh Day of December, 2012

David J. Kappos
*Director of the United States Patent and Trademark Office*